United States Patent
Chorn et al.

(10) Patent No.: US 7,562,274 B2
(45) Date of Patent: Jul. 14, 2009

(54) USER DATA DRIVEN TEST CONTROL SOFTWARE APPLICATION THE REQUIRES NO SOFTWARE MAINTENANCE

(75) Inventors: James Ernest Chorn, Tigard, OR (US); Thomas Green Hudiburgh, Carrollton, TX (US); Jay Joseph Nejedlo, Wilsonville, OR (US); Edward Keith Simpson, Anna, TX (US); Walter Michael Coldewey, Richardson, TX (US)

(73) Assignee: Asset Intertech, Inc., Richardson, TX (US)

( * ) Notice: Subject to any disclaimer, the term of this patent is extended or adjusted under 35 U.S.C. 154(b) by 300 days.

(21) Appl. No.: 11/465,080

(22) Filed: Aug. 16, 2006

(65) Prior Publication Data

US 2007/0079199 A1 Apr. 5, 2007

Related U.S. Application Data

(60) Provisional application No. 60/708,592, filed on Aug. 16, 2005.

(51) Int. Cl.
*G01R 31/28* (2006.01)
*G06F 11/00* (2006.01)

(52) U.S. Cl. ............... 714/726; 714/733; 714/31
(58) Field of Classification Search ............ None
See application file for complete search history.

(56) References Cited

U.S. PATENT DOCUMENTS

| | | | |
|---|---|---|---|
| 5,636,382 A | | 6/1997 | Chopko et al. |
| 6,009,256 A | * | 12/1999 | Tseng et al. ......... 703/13 |
| 6,088,821 A | * | 7/2000 | Moriguchi et al. ......... 714/724 |
| 6,567,971 B1 | * | 5/2003 | Banzhaf et al. ......... 716/18 |
| 7,043,391 B2 | | 5/2006 | Miyazaki |
| 2006/0195298 A1 | | 8/2006 | Ishizuka |
| 2007/0005322 A1 | * | 1/2007 | Patzer et al. ......... 703/14 |

OTHER PUBLICATIONS

Caffee, Tim; "ScanWorks for Intel IBIST—Easy, Affordable, Powerful" presentation, International Test Conference 2005, Austin, TX; ASSET InterTech, Inc., Richardson, Texas.
Caffee, Tim; "ScanWorks for Intel IBIST—Easy, Affordable, Power" presentation; ASSET InterTech, Inc., Richardson, Texas; Feb. 2005.
Nejedlo, Jay and Caffee, Tim; "Intel's Next Generation Test Methodology for Performance I/Os—Intel IBIST" presentation; Intel Developer Forum, Fall 2004.

(Continued)

*Primary Examiner*—Christine T Tu
(74) *Attorney, Agent, or Firm*—Carr LLP

(57) ABSTRACT

Methods and apparatus for performing a data driven test on a circuit including at least one built-in-self-test compatible device. In one embodiment, the method includes describing the device using a descriptive language including setting at least one default value associated with the device. The method also includes defining a scan path associated with the device, defining a netlist of the circuit, and configuring a test control program for the circuit. Additionally, the method includes changing the default value associated with the device. Testing the circuit after changing the value and using the test control program is also included wherein a portion of the test control program associated with the value remains substantially unmodified.

39 Claims, 15 Drawing Sheets

OTHER PUBLICATIONS

Intel Enterprise Server Group, "Intel's Next Generation Test Methodology for Performance I/Os—Intel IBIST" presentation; Intel Developer Forum, Fall 2004.

Caffee, Tim; "ScanWorks with Intel Interconnect BIST (Intel IBIST) Product Line" presentation; International Test Conference, Fall 2004; ASSET InterTech, Inc., Richardson, Texas.

Intel Enterprise Server Group; "ASSET Intertech, Inc." presentation; Enterprise Server Design Conference (ESDC), Taipei, Taiwan, Aug. 2004.

Caffee, Tim; "ScanWorks for Intel IBIST—Easy, Affordable, Powerful" presentation; Enterprise Server Design Conference (ESDC), Taipei, Taiwan, Feb. 2005; ASSET interTech, Inc., San Jose, California; Feb. 22, 2005.

ASSET InterTech, Inc.; "ScanWorks for Intel IBIST demonstration", video shown at International Test Conference, Santa Clara, California, Nov. 8, 2005 (document representative of video submitted).

ASSET InterTech, Inc.; "ScanWorks for Intel IBIST demonstration", demonstration given at Enterprise Server Design Conference, Taipei, Taiwan, Mar. 20, 2006 (document representative of demonstration submitted).

\* cited by examiner

FIG. 17

USER DATA DRIVEN TEST CONTROL SOFTWARE APPLICATION THE REQUIRES NO SOFTWARE MAINTENANCE

CROSS-REFERENCE TO RELATED APPLICATIONS

This application claims priority from U.S. Provisional Patent Application entitled "ScanWorks Framework for Interconnect Built-In Self Test" by Chorn et al., filed Aug. 16, 2005, Ser. No. 60/708,592, hereby incorporated by reference.

TECHNICAL FIELD

The invention relates generally to methods and apparatus for testing circuits and, more particularly, to methods and apparatus for testing circuits that include built-in-self-test (e.g., IBIST) compatible devices.

BACKGROUND

Interconnect Built-In Self Test ("IBIST") is a technology that allows a user to test the high speed interconnections between devices within an electrical system. The electrical system can be composed of one or more printed circuit boards. Accordingly, the devices must be integrated with the IBIST technology to enable this testing. The interconnections or buses between IBIST devices can be tested at functional speeds. For one type of IBIST test, the IBIST devices transmit test patterns across the bus to another receiving IBIST device. The receiving device compares the actual test patterns received against the expected test patterns to determine if the bus is functioning correctly. Accordingly, the receiving device can determine if the patterns were transmitted accurately. In another type of IBIST test, the receiving IBIST device may also be the transmitting device. In this case another device must loop back the test patterns to the transmitting IBIST device.

IBIST tests are controlled by configuring registers in IBIST devices. Today this is done by writing software (ITP scripts) to set bits within registers that control the different options that make up an IBIST test. ITP is a test harness software, which is commonly used for large test runs. For each new chip set that is released, new ITP scripts must be written.

To create these ITP scripts a user must be familiar with the registers of the IBIST devices. Each register, of course, includes one or more fields that are adjacent bit groups. This familiarity requires a detailed layout of the registers and fields of the devices. The user must also have a detailed knowledge of the ITP software and computer programming expertise. Due to these problems it can be difficult to create accurate IBIST tests. A method that could enable an unsophisticated user to run these IBIST tests would be an improvement over the prior art.

SUMMARY

The present invention provides methods and apparatus for testing circuits which include built-in-self-test compatible devices. More specifically, in one embodiment, a test controller (or test control program) is provided that may remain substantially unmodified yet still execute successfully even in the presence of modifications to the circuit which are made after the test control program is finalized. In one embodiment, the test control program is a DLL that preferably plugs into the ScanWorks® JTAG Solutions environment for boundary-scan (IEEE 1149.1 JTAG) technology which is available from ASSET InterTech, Inc. of Richardson, Tex.

In another embodiment a method may begin with describing a device using a descriptive language (e.g., the Boundary Scan Descriptive Language or BSDL) including setting at least one default value associated with the device. The method also includes defining a scan path associated with the overall circuit, defining a netlist of the circuit, and configuring a test control program for the circuit. Additionally, the method may include modifying the value associated with the device. The method may also include testing the circuit after modifying the value even though a portion of the test control program associated with the modified value remains substantially unmodified. As a result, and because the test control program remains unmodified after the value modification, the program may be considered to have been proven during the first test. Accordingly, the method may include limiting an investigation of an error that occurs during subsequent tests to the actual circuit and to the circuit definition (thereby excluding the test control program as a source of the error).

In other embodiments, the device may be an IBIST compatible device. Additionally, a register of the device can be described using the descriptive language. Further, the method can include modifying the register description and leaving the test control program substantially unmodified with respect to the modified register description. Moreover, a second register can be described as being accessed through the first register. The method may also include accessing one of the registers of the device through an operating system of the computer that is used to run the test. Moreover, the method can include describing a port associated with the device. Again, as with the register description, the port description can be modified even after the test control program is finalized.

In yet another embodiment, the method can include configuring the test control program in such a manner that the program accounts for a difference between the actual circuit to be tested and the circuit definition. Furthermore, the difference can be stored and used during the testing even though a portion of the test control program that is associated with the difference remains unmodified. Furthermore, a graphic user interface can be used to configure the test control program and to define the difference as well. In still other embodiments, a pass/fail indication may be generated at the conclusion of the test. Additionally, if the circuit fails the test, the method may include outputting the contents of all registers associated with the test (i.e., "dumping" the registers).

In yet another embodiment, a data driven system for testing a circuit is provided. The system may include a test harness, a memory, and a processor. The test harness communicates with the processor and with the circuit. The memory stores several items including a description of a device. Further, the description may include a default value associated with the device. A definition of a scan path that is also associated with the device may also be stored in the memory as is a circuit netlist. Additionally, a test control program for the circuit may be stored in the memory. In still another embodiment, the system includes a display for a graphic user interface used to define a difference between the circuit definition and the actual circuit to be tested. In operation, a modification to the value is stored in the memory and then the processor executes the test control program.

In yet another embodiment, a computer program product for performing a data driven test of a circuit including a built-in-self-test device is provided. The computer program product has a medium with a computer program embodied thereon which includes computer code for accepting a description of a device including at least one default value associated with the device. Likewise the product includes computer code for accepting a definition of a scan path and a netlist associated with the circuit. Furthermore, the product includes computer code for configuring a test control program for the circuit. The product may include computer code for changing the value associated with the device. The computer code may also have provision for testing the circuit.

BRIEF DESCRIPTION OF THE DRAWINGS

For a more complete understanding of the present invention and the advantages thereof, reference is now made to the following descriptions taken in conjunction with the accompanying drawings, in which:

FIG. 17 illustrates additional annotated examples of an IBIST device description.

DETAILED DESCRIPTION

This application claims priority from U.S. Provisional Patent Application entitled "ScanWorks Framework for Interconnect Built-In Self Test" by Chorn et al., filed Aug. 16, 2005, Ser. No. 60/708,592, hereby incorporated by reference.

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail.

Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. The functions may be performed by a processor such as a computer or an electronic data processor in accordance with code such as computer program code, software computer program product tangibly embodied on a physical computer storage medium, and/or integrated circuits that are coded to perform such functions, unless indicated otherwise.

The present invention uses a boundary scan framework to set the options in the IBIST devices and to read the results from the IBIST devices. The Boundary-Scan (IEEE Standard 1149.1-2001) Test Access Port (TAP) is used to access the IBIST test registers. Boundary-Scan is a standardized, industry-accepted protocol that is commonly known in the art. The IBIST graphical user interface can be integrated into a Boundary-Scan system. IBIST can validate the high-speed buses and determine specific faults regarding these buses.

Figure 1:
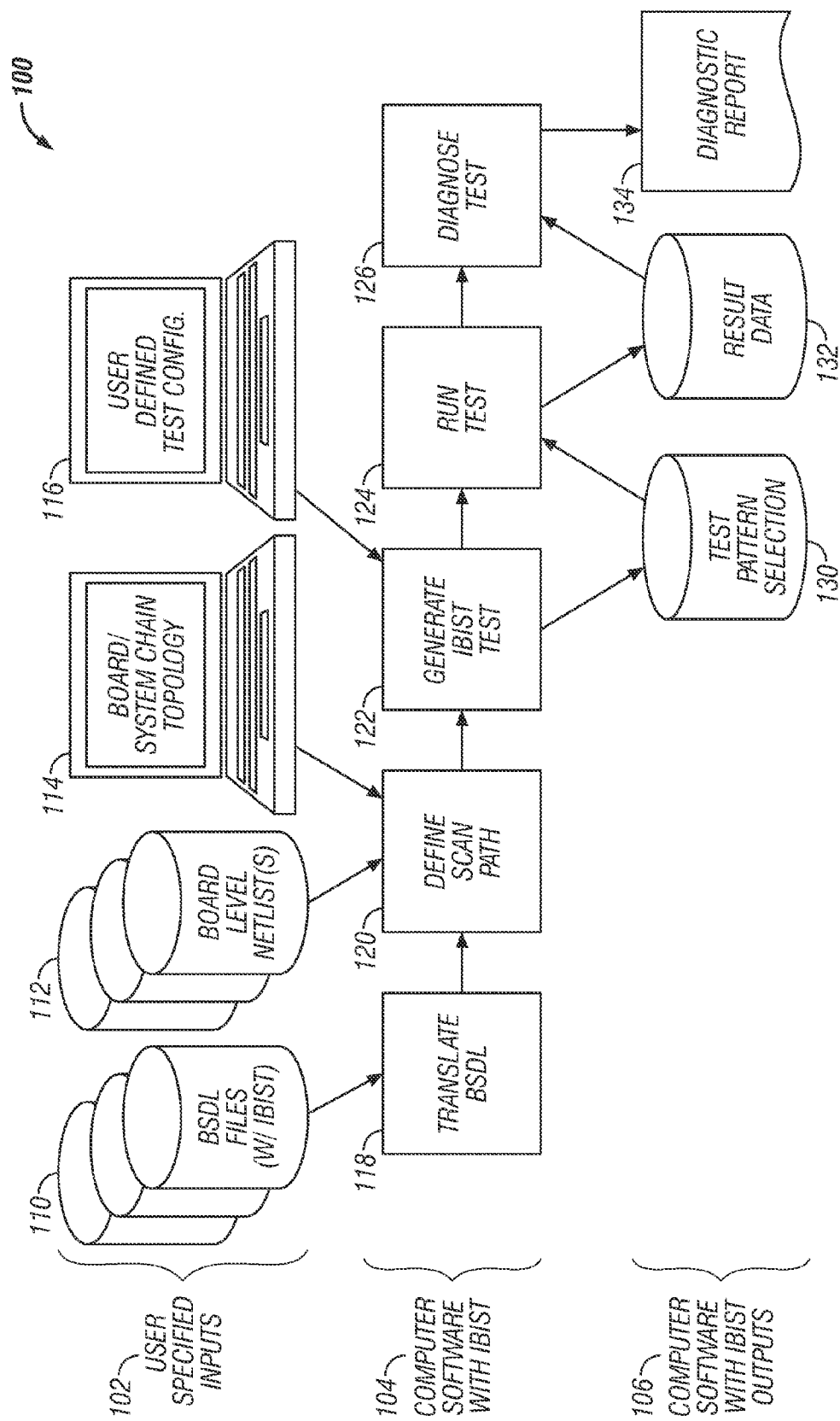
FIG. 1 illustrates the implementation of Boundary-Scan technology for use with IBIST testing.

With reference to FIG. 1, the present application first discusses IBIST testing at a general level. Then, with reference to FIGS. 2 and 3 the present application discusses a general graphic user interface which may be used to configure a test of an IBIST circuit. Then the present application discusses a more detailed set of graphic user interfaces for configuring IBIST tests. Finally, the current application discusses more detailed methods of configuring an IBIST test and then running the test.

Turning now to a general discussion of IBIST testing in accordance with the principles of the present invention, FIG. 1 illustrates the implementation of Boundary-Scan technology 100 for use with IBIST testing. The different facets of this Boundary-Scan system involve user specified inputs 102, computer software with IBIST 104, and outputs from the computer software with IBIST 106.

The user specified inputs 102 include boundary scan description language ("BSDL") files 110, board level netlist(s) 112, board/system chain topology 114, and user defined test controls 116. The BSDL files 110 store the descriptions of the boundary scan devices including the IBIST capabilities. The board level netlists 112 store the list of devices located on the circuit board and the corresponding interconnections between them. The board level netlist databases 112 can store netlists for various circuit boards to be tested. A user can run countless user-specific tests through the use of the BSDL files 110 and the board level netlists 112.

The board/system chain topology 114 is a user input that provides list of boundary-scan devices and their order in a serial chain to the system. The user defined test control 116 is a user input that selects the interconnections which are to be tested and other options for the test. These other options could include the type of data patterns and the number of times to repeat the tests. These user specified inputs 102 are provided to the computer software 104 to enable IBIST testing.

The computer software 104 has many functions in this implementation. This disclosure refers to computer software when describing the functions of boundary scan technology. First, the computer software 104 must translate the BSDL files 118. This ensures that the computer software 104 understands the descriptive language for the boundary scan and the IBIST environment, which will be tested. Then, the computer software 104 defines the scan path for the IBIST testing 120.

For defining the scan path 120 the computer software 104 utilizes the board level netlists 112, the user input, board/system chain topology 114, and the translated BSDL 118. The computer software 104 now knows the scan path for the IBIST test.

To generate the IBIST test 122, the computer software 104 utilizes the user defined test controls 116. The computer software 104 stores the test pattern selection 130 onto a disk (not shown) after the IBIST test is generated 122. The storage of this output 130 enables the computer software 104 to run the tests 124 and keep track of the test patterns selected. To run the tests 124 the computer software 104 reads the selected data patterns and other test options 130, configures the IBIST devices using this data, starts the data pattern transmission by the IBIST devices, waits for the devices to complete the test, and reports the results 132. The data patterns received by the IBIST test are stored as the results data 132. After the IBIST test is run 124, the computer software 104 diagnoses the IBIST test 126 through the use of the results data 132. From the diagnosis of the IBIST test 126, a diagnostic report 134 is prepared as an output for the user. It is understood that computer hardware is required to run the IBIST tests, but details concerning computer hardware have not been described in detail within this disclosure.

The diagnostic report 134 indicates if the selected circuit board interconnections passed or failed the IBIST test. A pass indicates that the selected interconnections are verified. If the circuit board interconnections failed the IBIST test the diagnostic report 134 informs the user where the errors were found. This enables the user to determine where faulty interconnections on the circuit board are located. Faulty interconnections may indicate that the data patterns are not transmitted accurately or at the desired speed. Through multiple IBIST tests a user can verify the interconnections on an IBIST enabled system.

Figure 2:
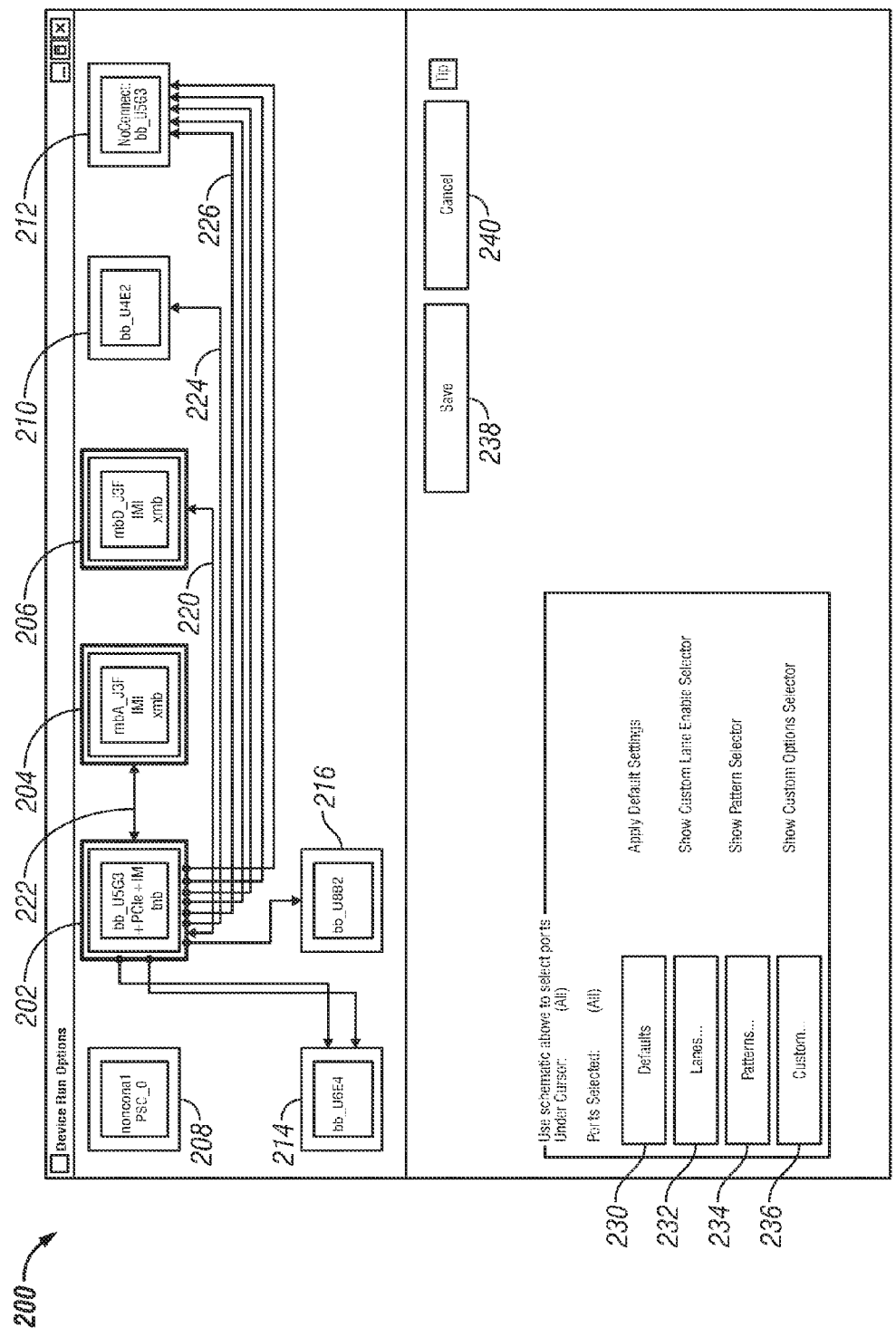
FIG. 2 illustrates a computer screen representation of the graphical user interface used to select ports for IBIST tests.

Turning now to the general graphic user interface, FIG. 2 illustrates a computer screen representation of the graphical user interface 200 which is used to select options for IBIST tests. For example, once the user has entered the information about a type of a system to be tested, this computer screen 200 enables the user to set up the specific IBIST test to run. The user inputs on this computer screen 200 correspond to the user defined test control 116 shown in FIG. 1.

In this example, devices in the system involved in IBIST testing are displayed. Devices 202, 204, 206 with the dark perimeter are IBIST devices. This means that these devices were designed and manufactured to enable IBIST testing. The other devices 208, 210, 212, 214, and 216 in the system are not IBIST enabled. Accordingly, IBIST devices 202, 204, and 206 can transmit and receive test patterns for IBIST testing.

The port lines with arrows on them represent the interconnections between the devices in the system. Each interconnection, for example 220, represents one port, wherein each port can contain multiple lanes. Interconnections 220 and 222 show arrows on both sides of the port line, which indicates that data can be transmitted in both directions. Accordingly, IBIST device 202 can transmit data to IBIST device 204, and IBIST device 204 can transmit data to IBIST device 202. Interconnections 224 and 226 show arrows on one side of the port line, which indicates that data can only be transmitted in one direction. Accordingly, IBIST device 202 can transmit data to non-IBIST device 210, but non-IBIST device 210 cannot transmit data to IBIST device 202.

For testing between IBIST devices 202, 204, or 206 the data patterns can be transmitted and received. For example, a test of the interconnection 220 involves transmitting the data patterns by IBIST device 202, and receiving the data patterns by IBIST device 206. The transmitting IBIST device can also be the receiving IBIST device. For example, a test of interconnection 220 involves IBIST device 202 transmitting the data patterns to IBIST device 206, IBIST device 206 transmitting the data patterns back to IBIST device 202, and IBIST device 202 receiving the data patterns.

IBIST testing can also be done with only one device capable of transmitting and receiving pattern data. Another device loops back the pattern data to the transmitting device. For example, a test of the interconnection 224 involves device 202 transmitting the data patterns to device 210, and device 210 looping back the data patterns to device 202. Device 202 compares the data patterns it transmitted to the data patterns it receives to detect errors.

The settings at the bottom of the computer screen 200 enable a user to further adjust the IBIST tests. A defaults setting 230 enables a user to reset the test options back to the options when the test was initially created. In one embodiment, the default setting 230 tests all of the lanes within all of the port shown on the computer screen 200. A lanes setting 232 enables a user to select specific lanes within a port to test. For example, port line 220 could contain eight lanes. The lanes setting 232 enables a user to select which specific lanes within port line 220 to test. Accordingly, a user can test lanes 1-4 in port line 220 without testing lanes 5-8. A patterns setting 234 enables a user to select the specific test patterns and other pattern options, such as the number of times to loop a pattern. This feature allows a user to tailor the IBIST test patterns for each IBIST test. A customs setting 236 enables a user to modify other features of the IBIST test, such as device or port specifics for the IBIST test. A save button 238 stores the modifications made in the dialog for the IBIST test, and a cancel button 240 discards the modifications made in the dialog for the IBIST test.

Figure 3:
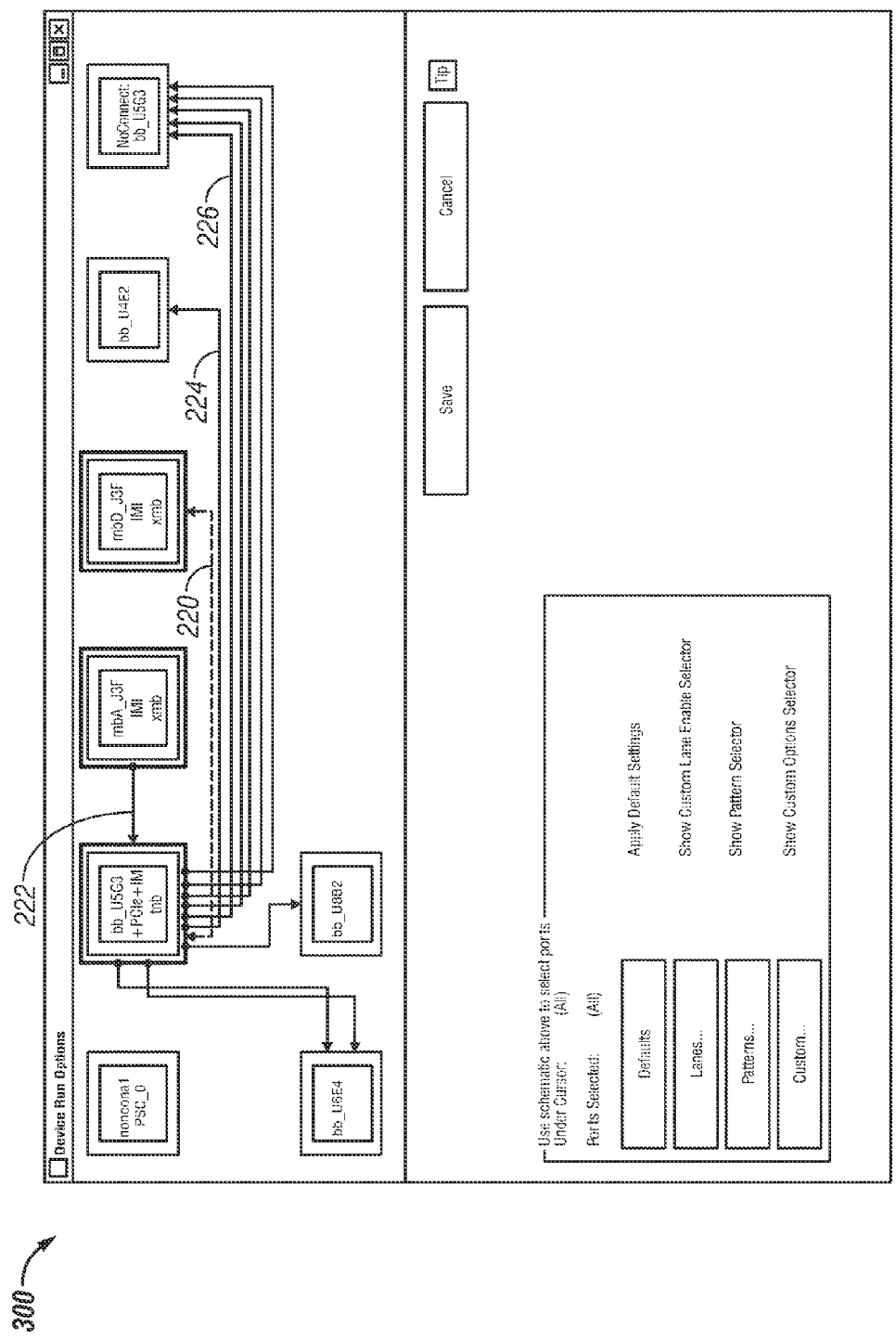
FIG. 3 illustrates an alternative computer screen representation of the graphical user interface, wherein one port is disabled.

FIG. 3 illustrates an alternative computer screen representation of the graphical user interface 300, wherein one port is disabled. FIG. 3 represents the same computer screen as FIG. 2 except that port line 220 shows a dashed line. The dashed line for port line 220 indicates that port line 220 has been disabled and is not involved in the present IBIST test. This graphical user interface 300 shows the user which port lines are enabled and which port lines are disabled. FIG. 3 is only provided as one embodiment, and the port lines can be represented in many different manners.

The dashed line 220 can be controlled by the user and a mouse (not shown), which is a common instrument used in conjunction with a computer. The IBIST testing between devices may be controlled by clicking on the port lines. In one embodiment, a left mouse click on a port line modifies its state. Other user inputs can be used to toggle groups of port lines or as a filtering mechanism for buttons 230, 232, 234, and 236. For example, a left click on a device may toggle all ports, a click on one side of the border may toggle the ports connected on that side of the device. A right click on the side border may filter only those ports when any of the buttons 230, 232, 234, or 236 are pressed. These optional user inputs are preferably available for the configuration of large or complex tests. If the port can only be tested in one direction the line 224 or 226 has two states. One state for enabled and one state for disabled. If the port can be tested in two directions, with each IBIST device being a transmitter and receiver, then the line 220 or 222 has four states. The states are; enabled in both directions, enabled in one direction, enabled in the opposite direction, and disabled in both directions. The effects of a click are also automatically reflected in the individual lane settings shown in 804 and 904.

The port line states can be represented by different colors and/or appearance of the port lines. For example, port line 224 can be green for enabled and red for disabled. A solid green port line can be for all lanes in the port enabled and a dashed green port line can be for a partially enabled port. Some of the lanes within a port are tested for a partially enabled port. As another example, port line 220 can be green with an arrow in both directions to represent that port line 220 is enabled in both directions; port line 220 can be green with a single arrow to represent that port line 220 is enabled in one direction; and port line 220 can be red to represent that port line 220 is disabled in both directions. Many other methods of representing the states of the port lines are suitable for use.

Figure 4:
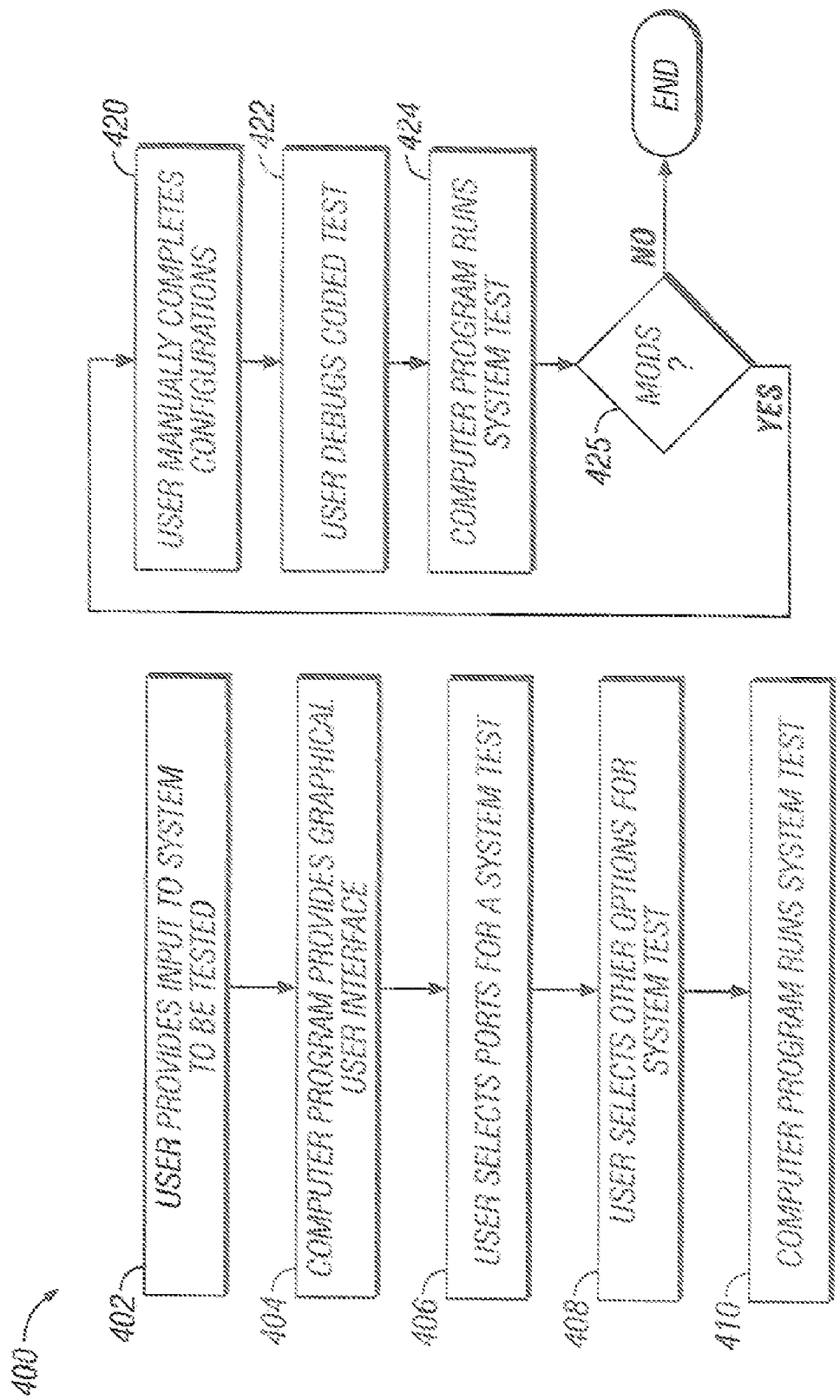
FIG. 4 illustrates a flow diagram representing a method of testing a circuit including an IBIST device.

FIG. 4 illustrates a flow diagram 400 representing a method of utilizing a graphical user interface to run a system test. First, a user provides inputs relating to a system to be tested 402. From the user-specified inputs, a computer program provides a graphical user interface 200, which represents the system to be tested 404. The user selects the ports for a system test by selecting the desired port lines 406. The user may select other options for the system test 408. Once the desired system test is provided, the computer program runs the system test 410. After the system test, the user can verify the system or determine the faults or errors within the system.

With reference now to FIGS. 5 to 12 another, more detailed, set of graphic user interfaces (GUIs) that may be used to configure IBIST circuit tests is illustrated. It will be understood by those skilled in the art, that the current embodiment includes two computer programs for facilitating 1) configuring an IBIST circuit test using a GUI and 2) actually running the IBIST test. Respectively, these programs may be referred to as a GUI configuration program (hereinafter the "GUI program") and a test control program.

Initially, the GUIs 600, 700, 800, 900, 1000, 1100, and 1200 include default values preconfigured by the GUI program at its startup. Depending on the test to be run and other factors the user might want to modify these values for each test. Accordingly, the options actually selected vary from test to test. But, again, the GUI program of the current embodiment initially configures the GUIs 600, 700, 800, 900, 1000, 1100, and 1200 without user intervention. Once the GUI is initially configured, the user may select values for the various default options presented in the GUIs thereby configuring the IBIST test. In turn, the GUI program overrides the default values imported from the circuit definition with the user selected values, thereby configuring the test control program for the test.

Figure 5:
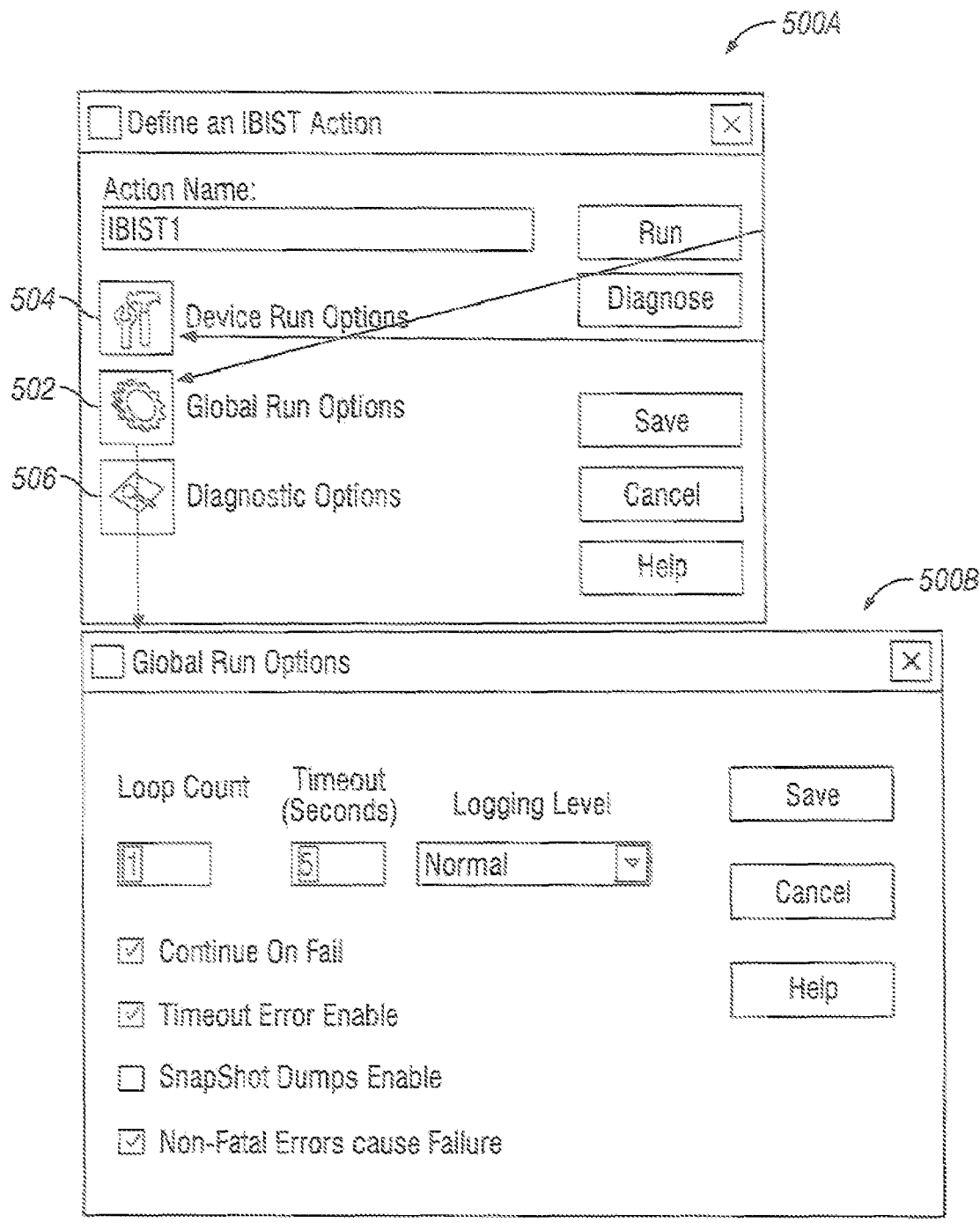
FIG. 5 illustrates a computer screen representation of the graphical user interface used to set general test options.

More particularly, when the user wishes to configure a new test, the user may invoke the GUI program or begin developing a script. In response, the GUI program may display the GUI 500A shown by FIG. 5. The GUI 500A is a top-level interface which allows the user to apply general test operations to the test being configured via a global run options button 502. The global run options button 502 invokes the GUI 500B on which the user enters appropriate choices for the exemplary options illustrated by FIG. 5B. These options are general testing options that, while test specific, are not generally described in the BSDL file. The user typically wants to have these options available so that more control can be exercised over the test control program when it runs a test. For example, the number of times the test is run is shown as a loop count (defaulted to 1 as shown in FIG. 5B). Another example could be the logging level that is used to control how much information is saved in test log files at run time. Similarly, a device run options button 504 is provided by GUI 500A to allow the user to set options for a particular device(s) to be tested via, for example, GUI screen 200. Similarly, GUI 500A provides a diagnostics button 506 to allow the user to set general options associated with diagnosing the results of the test on a similar GUI screen (not shown).

Figure 6:
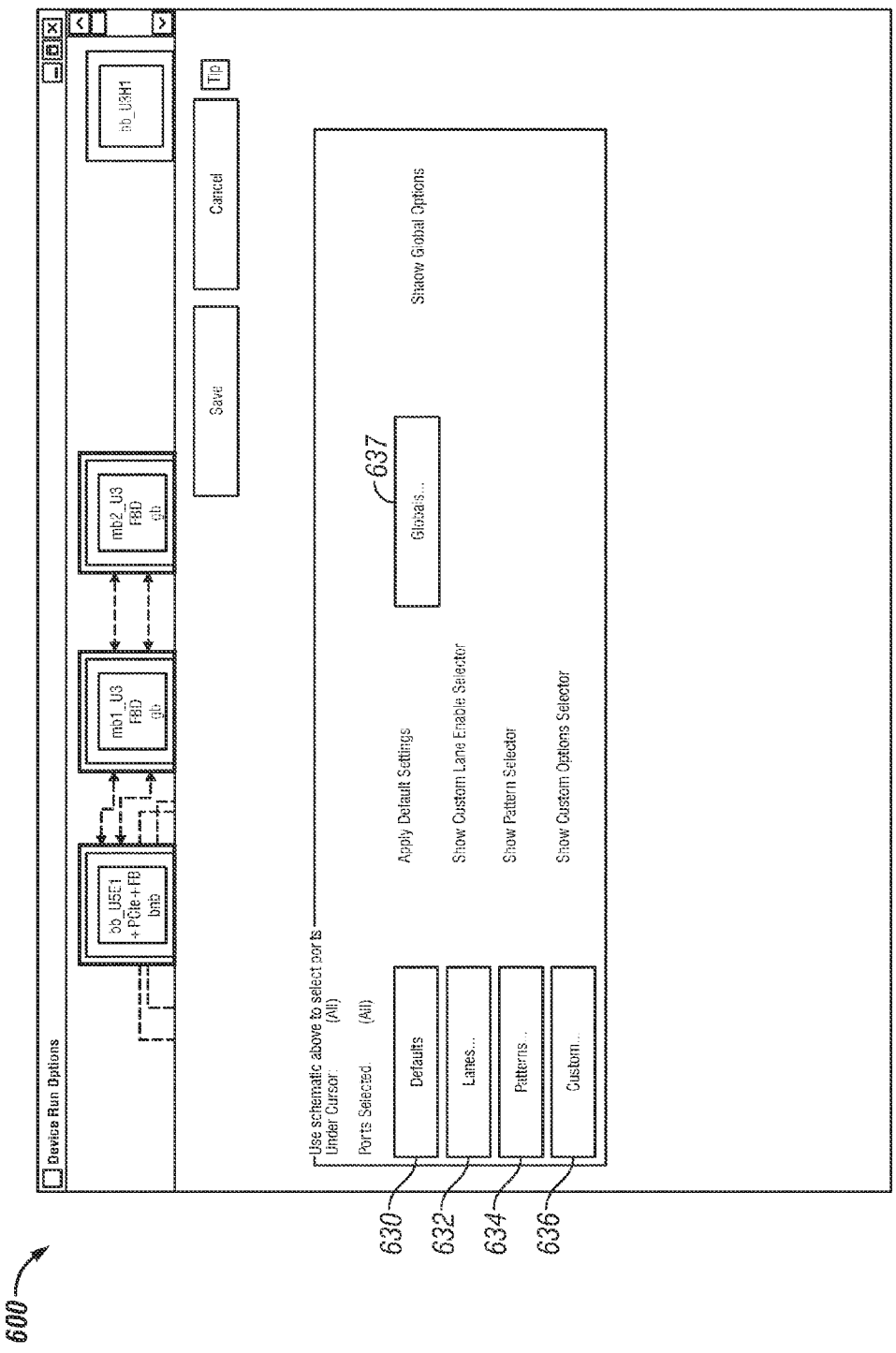
FIG. 6 illustrates a computer screen representation of another graphical user interface used to configure a test control program for a circuit.
Figure 7:
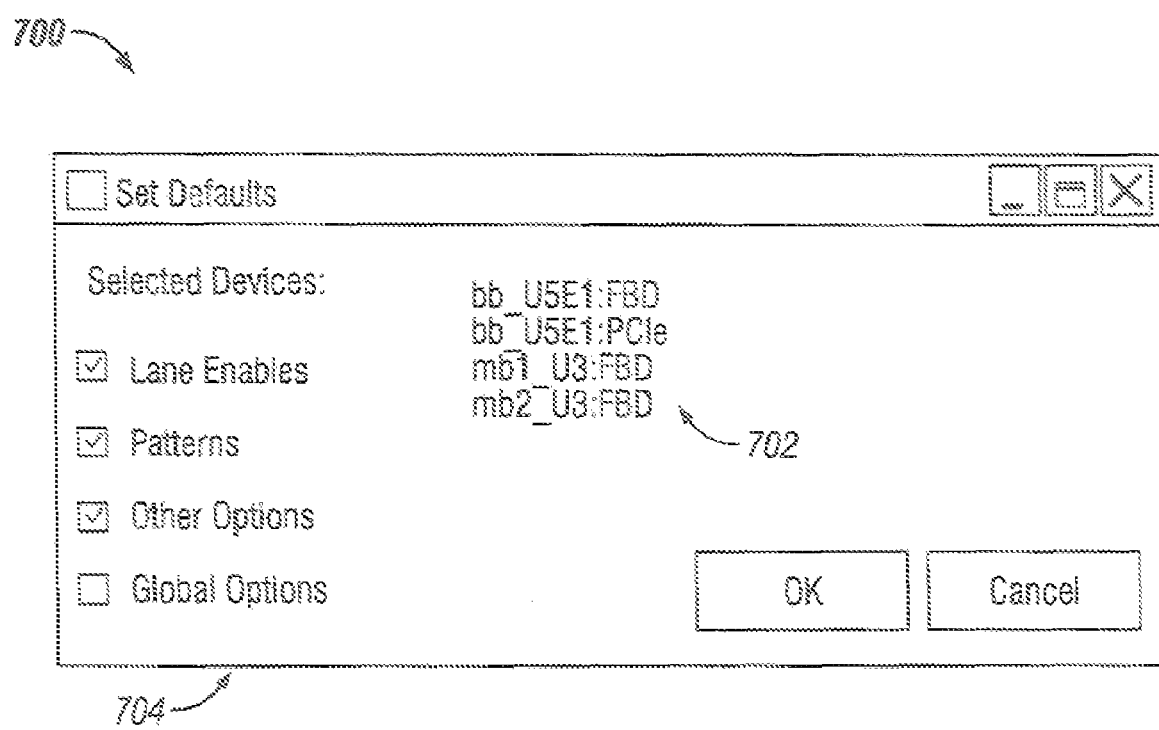
FIG. 7 illustrates a computer screen representation of the graphical user interface used to set test defaults.

Now with reference to FIG. 6, the GUI 600 is similar to the GUI 200 illustrated by FIGS. 2 and 3 except that the GUI 600 includes a globals button 637. GUI 600 allows the user to begin configuring the detailed test configuration. Thus, from the GUI 600, the user selects one of the buttons 630, 632, 634, 636, or 637 to access other GUIs for setting test options. These other GUIs 700, 800, 900, 1000, 1100, and 1200 have been populated by the GUI program with information from the device description(s) 110 of FIG. 1, the circuit netlist 112, the chain topology 114, and other sources (hereinafter the "circuit definition").

Accordingly, if the user selects defaults button 630 on GUI 600 (of FIG. 6), the GUI 700 (of FIG. 7) is displayed. More specifically, the GUI 700 includes a list 702 of four exemplary devices that have been described in the circuit definition. Further, the GUI 700 allows the user to accept the default values associated with these devices (which the GUI program imported from the circuit definition) by checking the appropriate check boxes 704.

Figure 8:
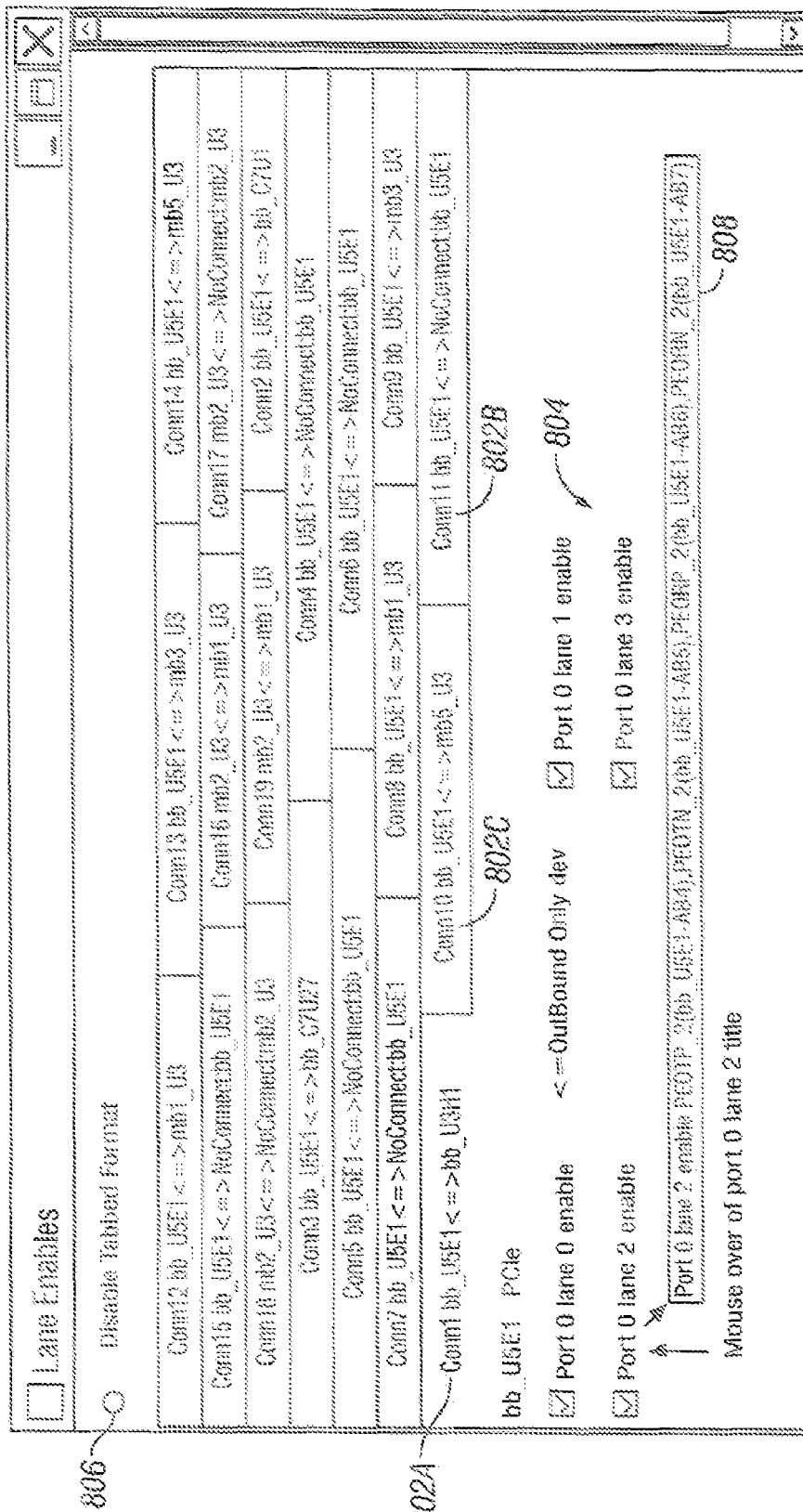
FIG. 8 illustrates a computer screen representation of a graphical user interface used to enable and disable ports and lanes for a test.
Figure 9:
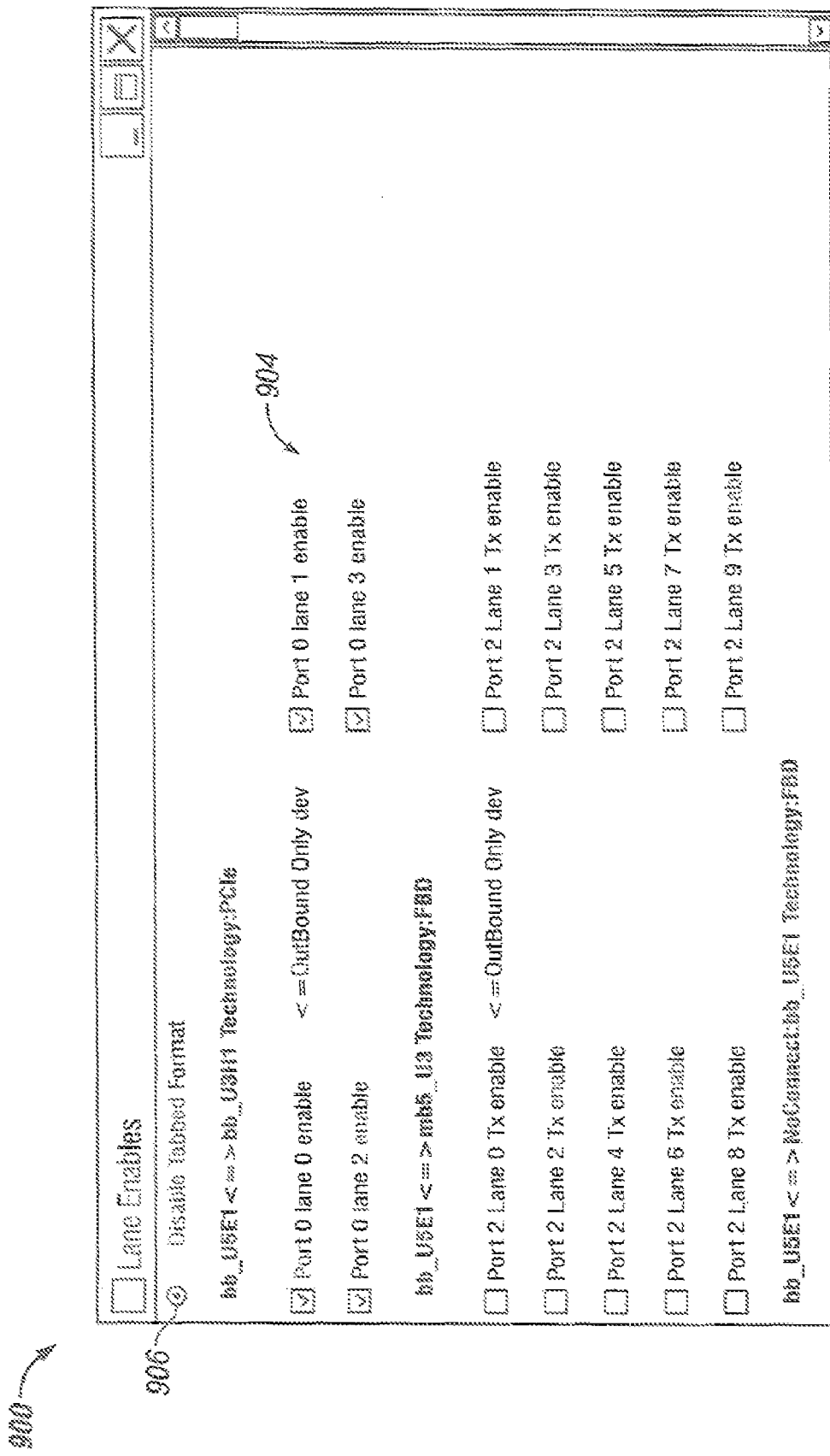
FIG. 9 illustrates a computer screen representation of another graphical user interface used to enable and disable ports and lanes for a test.

FIG. 8 illustrates that the GUI 800 (accessed through the lanes button 632) may be similarly populated with information regarding the ports and lanes of the devices in the circuit. Indeed, when any given tab 802 is selected, the port/lane enabling options 804 (imported from the circuit definition) are displayed on the GUI 800 for acceptance or modification by the user. FIG. 9 illustrates another format of a GUI 900 that allows the user to modify the port and lane enabling options 904. The different formats (i.e., GUIs 800 and 900) may be selected by toggling the disable tabbed format radio button 806 or 906.

Figure 10:
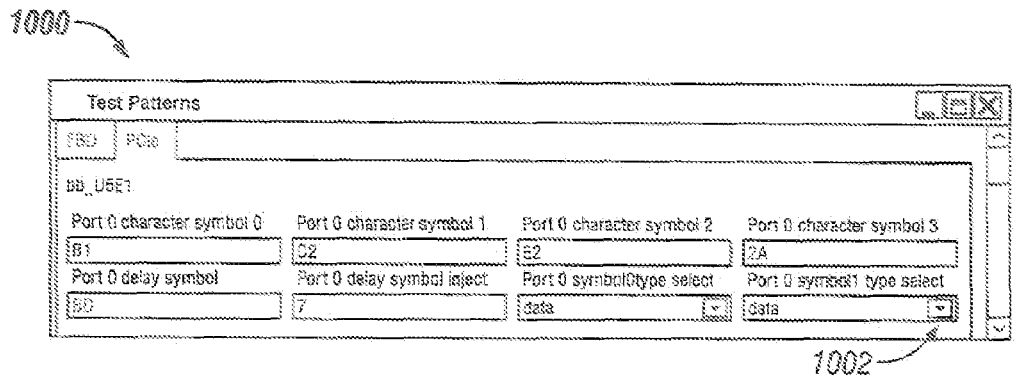
FIG. 10 illustrates a computer screen representation of a graphical user interface used to set test patterns.
Figure 11:
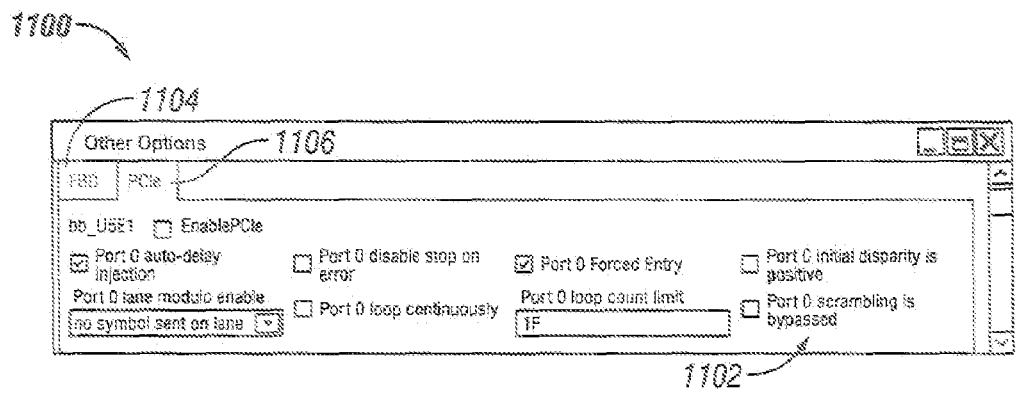
FIG. 11 illustrates a computer screen representation of a graphical user interface used to set other test options.

With reference now to FIG. 10, a GUI 1000 is shown which may be invoked by selecting the test patterns button 634 of GUI 600. The GUI 1000 allows the user to accept or modify the default test patterns 1002 to be used to test the various device ports. Additionally, GUI 1100 of FIG. 11 allows the user to customize other options associated with the test being configured of which several exemplary options 1102 are illustrated by FIG. 11. GUI 1100 may be invoked by selecting custom button 636.

Figure 12:
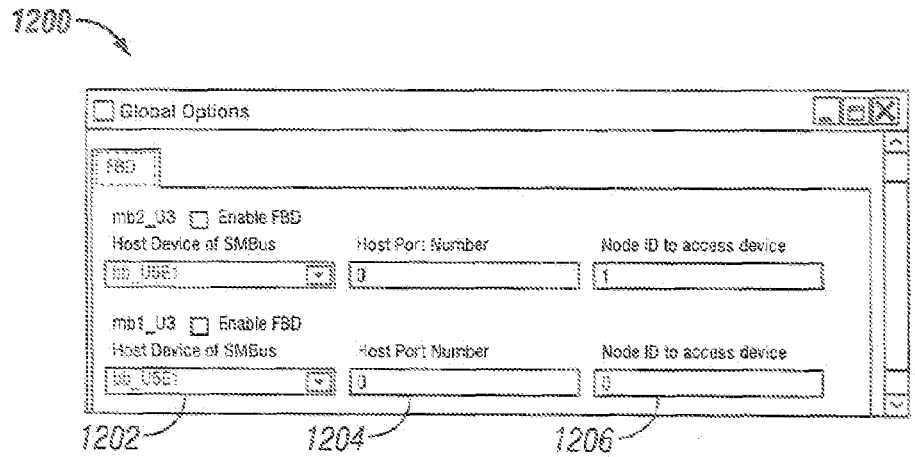
FIG. 12 illustrates a computer screen representation of a graphical user interface used to set customized "Global" test options.

FIG. 12 shows that the GUI 1200 can be used to handle special situations. For instance, the GUI 1200 allows a user to configure the test control program with information that is not easily obtainable from the circuit definition. One such special case occurs when devices exist in the circuit which require access methods beyond more than relatively simple JTAG (BSDL) register programming. Thus the description for these devices may need to include information regarding the device 1202, its channels 1204 (or ports), and any indexing 1206 required to distinguish each device and to reach the data present thereon. Thus, the special or customized information for the particular device, or type of devices, configured via GUI 1200 will apply globally to each of these particular devices, or device types, that appear in the circuit.

Figure 13:
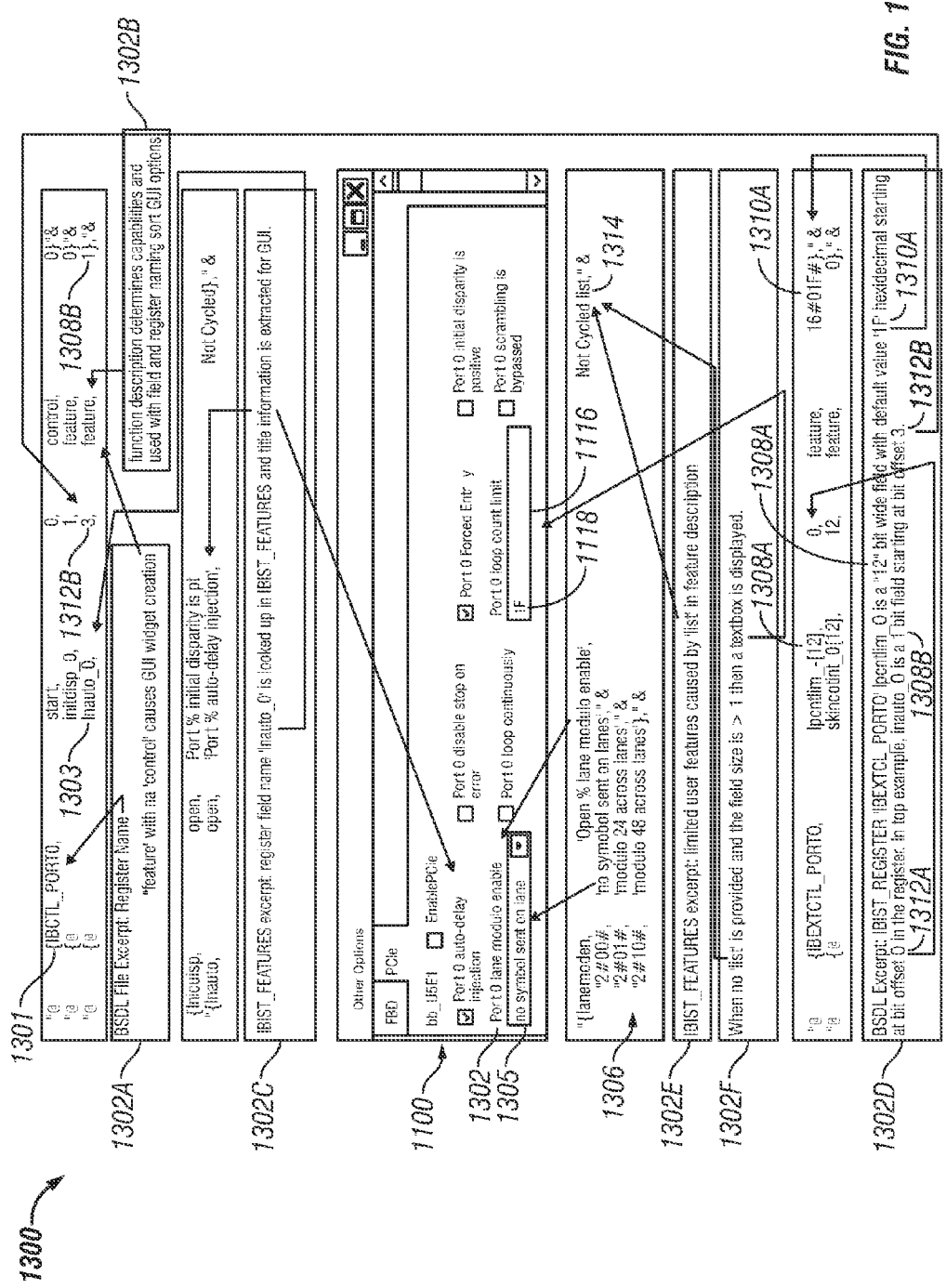
FIG. 13 illustrates an annotated example of an IBIST device description in a BSDL file.

With continuing reference to FIG. 12, information in the device description 110 alerts the GUI program that global options are associated with a particular device. Note that the descriptive information that alerts the GUI program to the presence of global options is similar to feature label 1302B (of FIG. 13). In FIG. 13 the feature label 1302B shows a case in which that particular feature has no global option associated with it. However, to indicate that a feature has a global option the device description author may add the word "global" to the word "feature" to alert the GUI to the presence of such a global feature. Accordingly, the GUI program adds the global options button 637 to the GUI 600 (of FIG. 6). Accordingly, the globals button 637, when present, invokes GUI screen 1200 to allow the user to set the global features.

Additionally, the devices shown by the GUI 600 may include device type information. For instance, device mb1_U3 of FIG. 6 is annotated with "gb" to show its device type. Other devices, of course, may be any IBIST device type such as "BNB" or other types that are present in the device description 110. Moreover, the device name "mb1_U3" shown in GUI screen 600 comes from the netlist and is written there during the process 1404 (to be discussed with reference to FIG. 14). The devices may also be annotated with their "device technology" to allow compatible devices to be configured and grouped together in the GUI, for example device technologies "FBD" and "PCIe" are shown as tabs in 1104 and 1106 (of FIG. 11). Another design description may include devices of only one technology (e.g., "FBD" as shown by GUI screen 1200 of FIG. 12). Moreover, the technology name may be automatically added to the GUI by the GUI program. Further, even devices that do not support IBIST may be displayed in the GUI 600 with their device type information. Accordingly, the GUI program displays the global options button 637 depending on whether the device being configured has registers with global options.

The GUI 1200 therefore allows the test configuration information from the netlists, which is associated with these devices, to be adjusted prior to running the tests. The global options provided for on GUI 1200 typically affect all tests for a particular circuit design and are meant to handle addressing requirements for devices that have more exotic access methods that may deviate from the simple access methods that the test control program typically uses to apply settings to the hardware registers at run time.

For instance, a device might not itself be on the test bus. Yet the device might communicate with a device on the JTAG chain (the test bus) thereby making data available through registers on the bus device. Thus, GUI 1200 allows the user to configure the test control program to access that data. However, it is preferred to define devices through ordinary device descriptions 110 (of FIG. 1) since use of the globals option GUI 1200 can affect other device configurations. In one embodiment, though, the GUI program may be configured such that the use of the GUI 1200 customizes only the device currently being configured.

Now with reference to FIG. 13, an example of a device description 1300 (which is similar to the device description 110 of FIG. 1) is illustrated along with the GUI screen 1100 and annotations 1302. Additionally, FIG. 13 shows several examples of how the GUI program can extract information from the device definition 1300 and configure the GUIs 600, 700, 800, 900, 1000, 1100, and 1200 for each of the configurable features of each of the devices in the circuit. Thus, the annotations 1302A to 1302F (in the form of notes and arrows pointing to various pieces of device information and to GUI objects) have been included in FIG. 13 to aid the reader in understanding the relationships between the information and the objects in GUIS 600, 700, 800, 900, 1000, 1100, and 1200.

For each of the configurable features that the GUI program finds in the device descriptions(s), the GUI program creates a GUI object through which the user can configure that feature. The type of object created depends on the field size and number of configurations available for the particular feature. Exemplary GUI objects used for this purpose include combination boxes, text boxes, and check boxes. Combination boxes may be used, for example, where there is a limited number of configurations for the feature identified in the device description. If the configuration allows a range of inputs then a text box is preferably used. On the other hand, if the configuration is binary (e.g., "on" or "off") then a check box may be used to configure the feature.

For example, Annotations 1302A and 1302B (shown near the top of FIG. 13) show that the entry of a feature of a register 1301 (e.g., IBCTL_PORT0) in the device definition 1300 causes the GUI program to create a new GUI screen 1100 which is shown near the center of FIG. 13 (and in FIG. 11). Further, the GUI object 1100 is labeled according to the title information of the feature. Further, the features and functions associated with the feature determine the initial configuration, the possible values, and the initial default value(s) to be associated with the GUI object for the feature. Thus, the feature description allows the GUI program to create the GUI object 1100 and configure it with default information imported from the device description 1300.

Annotation 1302C (shown near the top of FIG. 13) illustrates that the appearance of the field named "lnauto_0" in the device description 1300 causes the GUI program to look up title information for the GUI object in the IBIST_FEATURES portion of the device description 1300 that is associated with the register field lnauto. As shown, the IBIST_FEATURES information for field lnauto includes the title information "Port % auto-delay injection" and when combined with the "0" from the register name "IBCTL_PORT0" (or in some cases an underscore zero in the field name) gives a sufficiently descriptive title for the check box "Port 0 auto-delay injection". Thus, in the GUI 1100 (as shown on FIG. 13) features such as the "Port 0 auto-delay injection" checkbox is configured with default information on the GUI 1100 by the GUI program.

Additionally, in configuring the feature 1302 the GUI 1100 creates a combination box 1305 with which the user can select values from the options description 1306 (shown below the GUI screen 1100) that were imported from the description 1300 and associated with the combination box 1305 in a drop down list. The title information ("Port 0 lane modulo enable") for the combination box 1305 may be extracted by the GUI from the feature information in feature description 1306 for example for the field "lanemoden" of a given register (not shown).

Further, the selections provided in the combination box 1305 may be presented to the user in a constrained list 1314. Three exemplary values (obtained from the feature description 1306) of "2#00#", "2#01#" and "2#10#" (which are standard VHDL base 2 notation for values 0,1 and 2) are shown as "no symbol sent on lanes", "modulo 24 across lanes" and "modulo 48 across lanes" respectively. Further, these three exemplary values are the only values the GUI object 1305 allows the user to select from the four possible values available. Thus, in the current embodiment, the GUI object 1305 can provide some protection from undesirable test configurations.

Additionally, annotation 1300D (shown near the bottom of FIG. 13) illustrates that for a given register field the GUI program searches for the field size 1308A, the default value 1310A, and the bit offset values 1312 in the device definition 1300 to configure the corresponding register GUI objects.

Annotation 1302F (in the lower left corner of FIG. 13) shows that where a field (e.g. field lpcntlim_0) has a number of potential values that may be greater than 2 because the field size is greater than 1 (as in 1308A), and the field is not constrained to specific values from a list (as in feature description 1306 and further in 1314) the GUI program creates a text box 1116 in the GUI screen 1100 for the field "lpcntlim_0" (shown next to 1308A) The text box 1116 associated with the field "lpcntlim_0" is accordingly titled "Port 0 Loop Count Limit" by the GUI program in a manner that is similar to the GUI object titling for the field "lnauto".

Further, annotation 1300F shows that where no list of values is supplied for a field (e.g., "lpcntlim_0" shown next to field size 1308A) the GUI program makes provisions for the user to enter configuration data 1118 in a text box 1116 using the default value "16#1F#" from 1310A (which is standard VHDL syntax for a base 16 hexidecimal value of "1F") as displayed in 1118. Further, the GUI can still function if no title information is present in the description 1300 using the field name 1303 as a title. In a similar manner, the GUI program searches, or parses, the netlist 112 and chain topology 114 of FIG. 1 for information with which to configure the GUIs 600, 700, 800, 900, 1000, 1100, and 1200. Thus, the exemplary annotations above illustrate how the GUI program searches the device definition 1300 for information and creates corresponding graphical objects in the test configuration GUIs 600, 700, 800, 900, 1000, 1100, and 1200.

Figure 14:
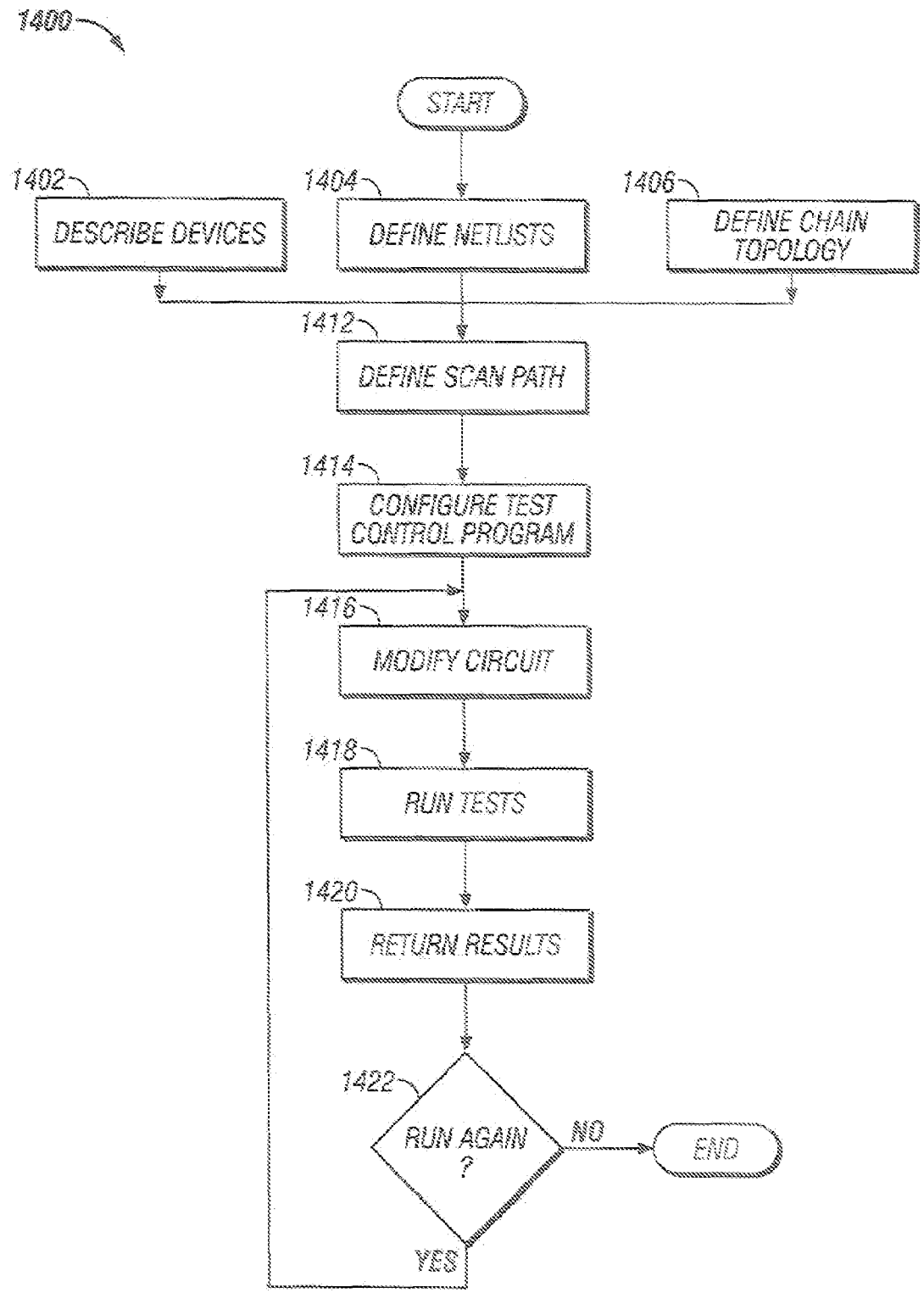
FIG. 14 illustrates a flow diagram representing another method of testing a circuit that includes an IBIST device.

Turning now to FIG. 14, the figure illustrates a flow diagram representing another method 1400 of testing a circuit. It will be understood that the user may, or may not, use the GUIS 600, 700, 800, 900, 1000, 1100, and 1200 to implement many of the operations discussed in regard to method 1400. Operation 1402 of FIG. 14 illustrates that a user may begin the method 1400 by systematically defining one or more IBIST devices using the BSDL descriptive language. Of course, the BSDL is a subset language of VHDL (Very High Speed Integrated Circuit Hardware Description Language). Both the BSDL and VHDL languages are IEEE standardized languages frequently used in the design, development, testing, and fabrication of digital components. Therefore, the extensions used to describe the circuit to be tested preferably conform to one of these standardized languages (or their equivalents). Moreover any descriptive language may be used which describes the features and logic of the circuit such that the resulting file may be used, for example, to automatically generate test patterns for the circuit.

Additionally, in operation 1402 the user may define one or more registers associated with these devices. It is preferred that all of the registers on the device be defined although the user may define some, or none, of the registers. For example, the user could define only those registers involved in a particular test (or those registers likely to be involved in the test). However, the user may then find it necessary to hard code (and maintain) portions of the test configuration program related to the un-described registers. Additionally, the user may also define registers on the device which will be accessed through other registers.

In operation 1402 the user may also define one or more ports and other features and options associated with the IBIST device(s). As part of operation 1402, the user selects default values for the options and features associated with the device. Preferably, all of the device description information is translated from the resulting BSDL file and stored in a database. Afterward, the user remains free to modify the device definition 1300 throughout the method 1400 with the GUIs 600, 700, 800, 900, 1000, 1100, and 1200 being dynamically updated accordingly by the GUI program.

In operations 1404 and 1406, the user may further define the circuit. More specifically, reference 1404 shows that the user may define the netlist 112 that describes the circuit. Similarly, the user may define the chain topology 114 of the test bus including the order of the various devices as they appear on the bus. See operation 1406. The resulting files 110, 112, and 114 of FIG. 1 therefore define the circuit as well as the test bus. Accordingly, the thoroughness and consistency of the parsing of the circuit definition (by the GUI program and the test control program) may be improved by consistently and thoroughly defining the circuit. Once the initial circuit definition is created, the user may prefer to debug the definition using well known techniques to ensure that the definition adequately conveys the design of the circuit (and the devices therein). In any case, once the component parts of the circuit definition (the device description 110, the netlist(s) 112, and the chain topology 114) are created they are re-useable for the lifetime of the circuit (or until the circuit is modified).

Using the device description 110, the circuit definition 112, and the chain topology 114 (created in operations 1402, 1404, and 1406) the GUI program defines the scan path 120 as shown at reference 1412. Furthermore, because the circuit has been defined at this point, the GUIS 600, 700, 800, 900, 1000, 1100, and 1200 of FIGS. 6-12 may be created by the GUI program as shown in operation 1412. More particularly, when the GUI program begins executing, it may determine the devices on the scan path from the chain topology information 114 and include these devices 702 in the GUI 700 of FIG. 7. The GUI program may also use the device description 110 to get 'pin' information for the various devices 702 on the scan chain. From the pin and netlist information, the GUI program determines the appropriate devices to add to the GUI 800 (or 900) along with the connections between them.

The pin information preferably resembles a BSDL 'feature' function. Further, the pin information is preferably syntactically similar in nature to the register descriptions (to be discussed further) and used in a similar fashion to configure the GUIs 800 or 900. Since the pin information is readily available to the GUI program, the GUI program may cause the pin assignments 806 associated with a lane or port to be displayed if the user mouses over one of the port enabling options 804. FIG. 8 shows several such multiple pin connections 808.

Similarly, the GUI program also uses the netlist information to build the GUIs 600, 700, 800, 900, 1000, 1100, and 1200 in operation 1414. More specifically, the GUI program parses the netlist when it is first entered (or modified). This parsing results in a database or, preferably, an XML file from which the GUI program can import additional information regarding the circuit.

The GUI program also extracts the translated device description 110 of FIG. 1 from the database to configure the GUIs 600, 700, 800, 900, 1000, 1100, and 1200. More specifically, the device description 110 contains sufficient information for the GUI program to determine what kind of display object to use for each device, feature, or function. For objects having user selectable items at least three types of graphic symbols may be used. For example checkboxes, combination/list boxes, and textboxes may be used to present the user the choices available for the various devices, features, and functions. For a one bit field associated with a particular register, the GUI program may create a checkbox during operation 1414. For a two (or more) bit field with no limits, the GUI program may display a blank textbox to allow the user to enter appropriate data. Of course, the user who creates the device description 110 may also determine the choices or limits for the user selections. For instance, if the user who defines the circuit wishes to present the tester (i.e., another user) with only four values for an item with a four bit field (having 16 possible values), the GUI would allow only the four selections to be available in the resulting combination box. Finally, the GUI program may also choose the name of the item in the device description 110 as the label for the resulting GUI object in operation 1412.

Of course, the user may elect to write scripts to configure the test instead of using the GUIs 600, 700, 800, 900, 1000, 1100, and 1200. If so the script writer may use list or command line techniques to alter the defaults in the circuit definition. In the alternative, the user may hard code the modifications prior to testing. However, in doing so, the user may not enjoy some of the advantages provided by the present invention. Namely, the GUIs 600, 700, 800, 900, 1000, 1100, and 1200 provide a quick, efficient, and error-free tool with which to configure test control programs (see operation 1414). Further, as the user updates or modifies the circuit definition in operation 1416, the GUI program may automatically update the GUIs 600, 700, 800, 900, 1000, 1100, and 1200. Thus, to the user it may appear that the GUIs may continually configure itself.

With further reference to operation 1412, the ability to enable and disable ports and to set and alter user options and other features via the GUIs 600, 700, 800, 900, 1000, 1100, and 1200 allows the user to intuitively configure the test control program. More specifically, the user may configure the test control program to reflect the actual configuration of the circuit in operation 1414. This advantage may frequently accrue because it is often the case that the circuit, or circuit board, arrives with an incomplete set of components connected to it. The reasons for such unexpected circuit configurations are many but include unavailability of production parts and the presence of prototype or brass board components on the circuit board.

Thus, the user may also find it desirable to modify the default settings previously applied during the definition of the circuit in operations 1402, 1404, and 1406. Of course, these default values may be automatically presented in the GUIs 600, 700, 800, 900, 1000, 1100, and 1200 as part of the GUI program's self configuration during operation 1414. The user enters the desired modifications to the default values through the GUIs 600, 700, 800, 900, 1000, 1100, and 1200 thereby allowing the test control program to account for the differences between the circuit definition and the actual circuit to be tested. Thus, the user may alter the test control program easily via the GUI 600, 700, 800, 900, 1000, 1100, and 1200 without performing any coding (or maintenance) associated with unexpected circuit configurations. The user may then store the test control program (in an XML format for example) for subsequent use.

Moreover, the information relating to the actual configuration of the circuit (and hence differences between it and the circuit definition) may also be stored for future use in operation 1514. In other words, the test control program that was configured prior to these circuit modifications may be re-used without alteration despite circuit modifications. In the absence of the invention, of course, any portion of the test control program that had been coded for a specific element of the un-expected circuit configuration would have to be re-coded or, worse yet, scrapped and re-coded. Thus, the present invention vastly reduces, if not eliminates, the amount of maintenance that might otherwise be required on the test control program. Accordingly, operation 1416 shows that the circuit definition may be modified without necessitating re-coding portions of the test control program that might otherwise fail (or produce an error) due to the modification.

With continuing reference to FIG. 14, operation 1418 shows that the unmodified test control program (preferably configured using the GUIS 600, 700, 800, 900, 1000, 1100, and 1200) may be used to perform the circuit test even in the presence of modifications to the circuit. Further, since all of the registers, ports, features, and functions of the device are also preferably described during the circuit definition operations 1402, 1404, and 1406, the test control program will be able to access all registers of the devices. In the alternative, the test control program may access all of the registers through the operating system (e.g., through the MicroSoft COM DLL).

Once the test is run successfully in operation 1418, the test control program may be presumed to be proven. This result occurs because the test control program is configured via the circuit definition which is defined in operations 110, 112, and 114 instead of being hard coded. For similar reasons, the test control program will likely require no further modifications or maintenance after it runs once. Indeed, after running the test in operation 1418, the user may return repeatedly to operation 1416 to modify the circuit definition and repeat the test without modifying the test control program. Having said that, it is of course possible for the user to modify the program for other reasons. Thus, the test control program may remain substantially unmodified with respect to the modification of the circuit definition while allowing for other modifications of the test control program.

After running the test in operation 1418, the test control program may return a pass/fail indication to the user via any convenient means. In the alternative, or in addition, the system may dump the contents of all relevant registers to a display, a memory, or to an external program. Further, the test control program may output the results of the test (the pass/fail indication and the content of the registers) into an XML file for evaluation and storage as shown by reference 1420. Otherwise, no parameters need be passed to or from the test control program. If the test results indicate that a modification to the circuit is desirable, then the user may elect to return to operation 1416, modify the circuit and its definition, and repeat the test in operation 1418. Again, the modifications to the circuit will not necessitate modifying the program. After operation 1418, the user may also elect to end the test as shown at decision 1422.

Figure 15:
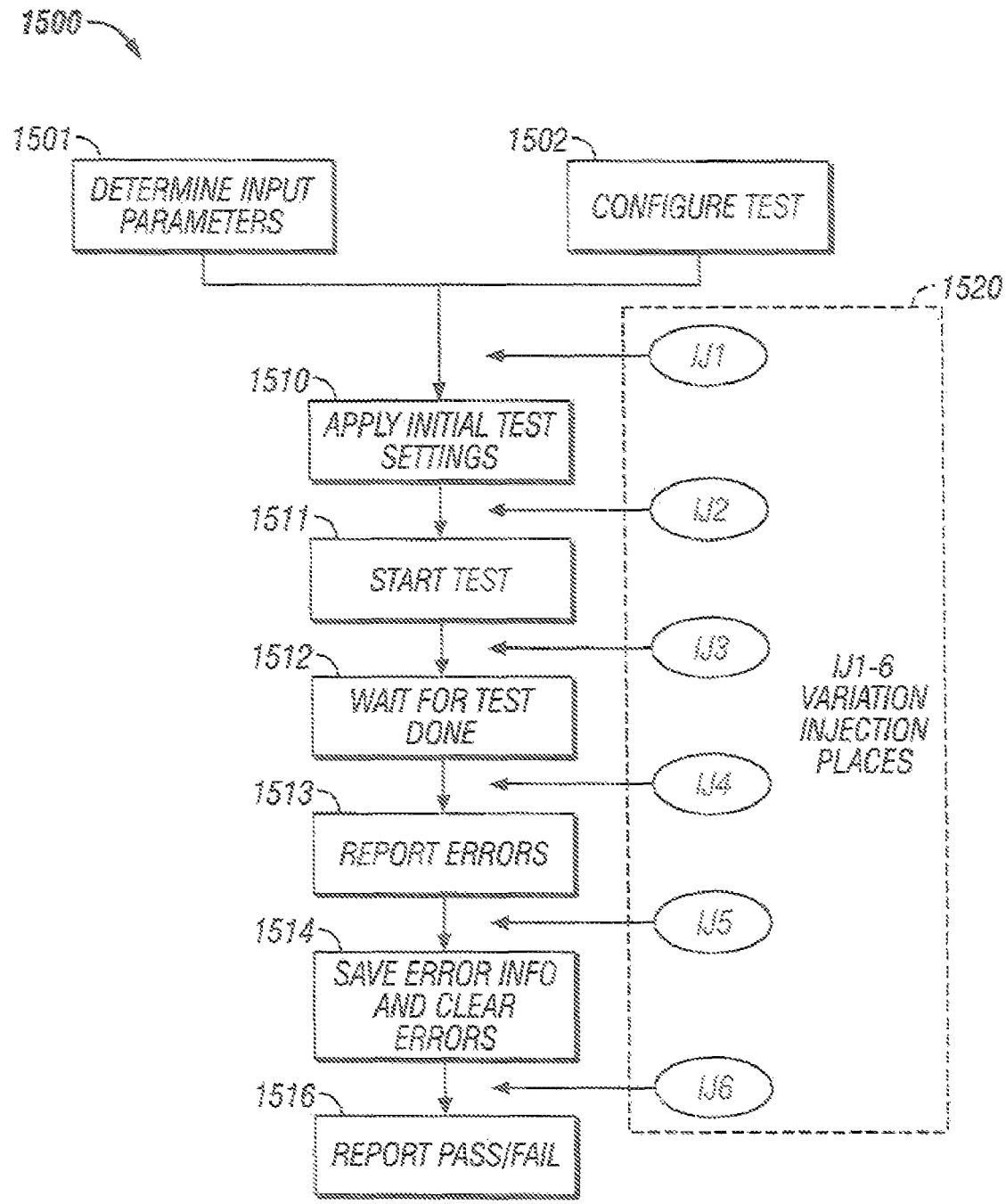
FIG. 15 illustrates a flowchart representing a method of performing a test with a test control program.

With reference now to FIG. 15, a method that uses a script to execute a test is illustrated. Normally, the user inputs the values and otherwise codes a program (i.e., a script) to account for the circuit definition and the values that he wishes to use in relation to the circuit definition related coding. That is, the user may code the test configuration. The user thus inputs this collection of parameters necessary to do so in operation 1501. By way of comparison, operation 1502 illustrates that the user may instead use the test control program of the present invention and the GUIs of FIGS. 6 to 12 to configure the test.

Regardless of how the test is configured, the user then may apply the initial test settings to the test configuration in operation 1510. Next, the user may execute the test as in operation 1511. After the test completes in operation 1512, the test results may be reported in operation 1513. Then, as illustrated by the method 1500, any errors that occurred during the test may be saved for future study and cleared. See operation 1514. In addition, a pass/fail indication may be generated for the test as indicated at reference 1516.

During, and between each of these operations 1501 (or 1502), 1510, 1511, 1512, 1513, 1514 and 1516 the user may find it desirable to modify the test configuration to account for variations (or modifications) to the circuit design or circuit test configuration. As those skilled in the art understand, the circuit design and circuit test configuration may be evolving and are not static. More particularly, register, field, and bit locations change as the design and test of the circuit proceeds. Accordingly, FIG. 15 illustrates modification injection points IJ1 to IJ6 (collectively: variation injection places 1520) where modifications to the circuit and test configuration inject variations into the test that must be accounted for by the script writing user.

Thus, to configure the test these users must keep track of (among other things) register organization and addressing information. Moreover, each occurrence of these types of information must be maintained in the code to account for the modifications. In contrast to the script writer, those users that use the present invention update the design definition instead and allow the test control program to import the modifications. Additionally, the user may employ the GUIs 600, 700, 800, 900, 1000, 1100, and 1200 to further modify the test configuration.

Moreover, some devices may require test configuration modifications for many well known reasons. For example, a prototype device may have special register access requirements that must be accounted for by the test configuration. Typically, these modifications are accounted for at injection point IJ2 of FIG. 15 by the script writer with a custom portion of script unique to that device. Of course, it is unlikely that the custom code can be re-used without modification. For the foregoing reasons it is preferred that the test control program of the present invention be used to configure the test. Likewise, it is preferred that the GUI program of the present invention also be used to configure the test.

Figure 16:
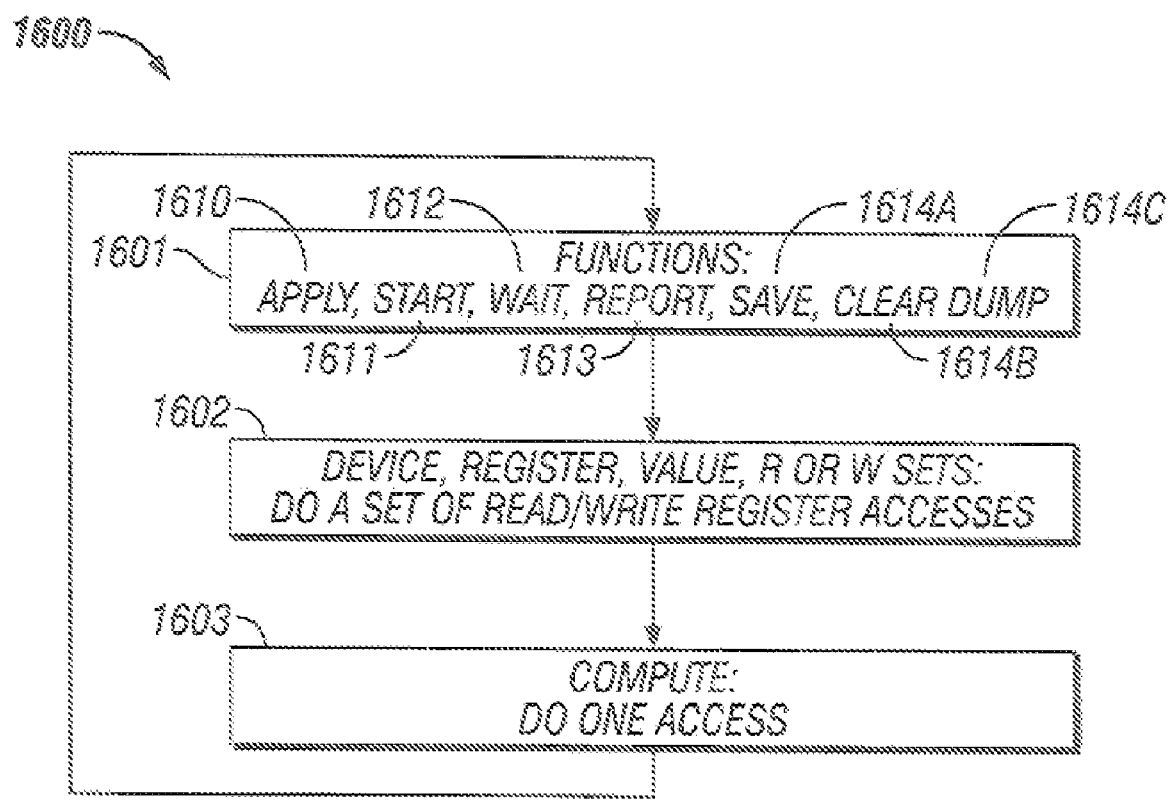
FIG. 16 illustrates a flowchart representing an algorithm of a test control program.

Accordingly, several additional aspects of the present invention are illustrated by FIG. 16. FIG. 16 shows an algorithm used by the test control program to execute the various operations 1510 to 1514 of FIG. 15. It should be noted that the various devices in the circuit may have associated with them functions 1610 to 1614 that correspond to each of the operations 1510-1514 that the test control program executes. For example, a given device register may have a start bit 1611 that needs to be set in operation 1511. Or, another device register may have an initial value 1610 that needs to be applied in operation 1510. Accordingly, the device information necessary to execute the device functions 1610-1614 corresponding to the operations 1510 to 1514 is preferable encapsulated in the device description.

With the function 1610-1614 information encapsulated in the device description in this manner, the test control program loops through algorithm 1600 as it executes the operations in method 1500. More particularly, the test control program searches the device description(s) for devices that have initial test settings to be applied in operation 1601. It then accesses the devices or registers necessary to execute the function in operation 1602 and executes that function for each of the devices. The test control program then loops to the next function 1610 to 1614 and repeats the algorithm as indicated by operation 1603.

If the test control program of the current invention is used to execute the method 1500 then the algorithm 1600 obtains the encapsulated information necessary to perform these common functions 1510 to 1514 from the device description. In contrast, if the user has written a test configuration script, user must maintain the code associated that is used to execute functions 1510 to 1514. Indeed, it may be necessary to maintain these potentially large portions of the script each time the method 1500 is run through modification injection points IJ1 to IJ6.

Thus to write and maintain a script, the specific functions 1610 to 1614 of each bit in each register must be known. Further, the method of accessing the registers and bits in operation 1602 must also be known by the script writer and kept up to date. Again, use of the test control program avoids these labor intensive maintenance operations by obtaining the information from the device description. Accordingly, the test control program may remain unmodified when the device design changes. Instead, the user merely updates the device description.

Some of the results of avoiding modifications to the test control program (or the script) are illustrated with reference to FIG. 4. Operations 420 to 424 show the amount of maintenance that is required to maintain a test script. Initially, the user must manually code the script in operation 420. For even a modest circuit test operation 420 may consume user-weeks of effort. In operation 422, the user debugs the script as necessary to detect, isolate, and fix the various errors that are likely to occur due to the amount of code generated in operation 420. Again, much user effort is expended in operation 422. Then, the user runs the test in operation 424. If any errors occur during the test 424, or if any modifications have occurred during the preceding steps, the user must return to operation 420 and maintain the code. See decision 425. Only when the errors and modifications cease may the user discontinue maintaining the code.

In contrast, to the code maintenance loop illustrated by operations 420, 422, 424, and 425, operations 402, 404, 406, 408, and 410 of FIG. 4 illustrate the once-through test configuration method provided by the current embodiment. In particular, the manual maintenance of the code shown by operation 420 is eliminated since the test control program does not change. Furthermore, much of the de-bugging shown by operation 422 is eliminated also because the unchanging test control program is generally proved by the first successful test of the circuit.

In contrast, by using the present invention the user prepares a circuit description, checks that the test configuration is that which was expected, and configures the test accordingly. Further, minor algorithmic alterations do not cause changes in the test control program but in the circuit description, thus preserving backward compatibility for each test description.

Figure 17:
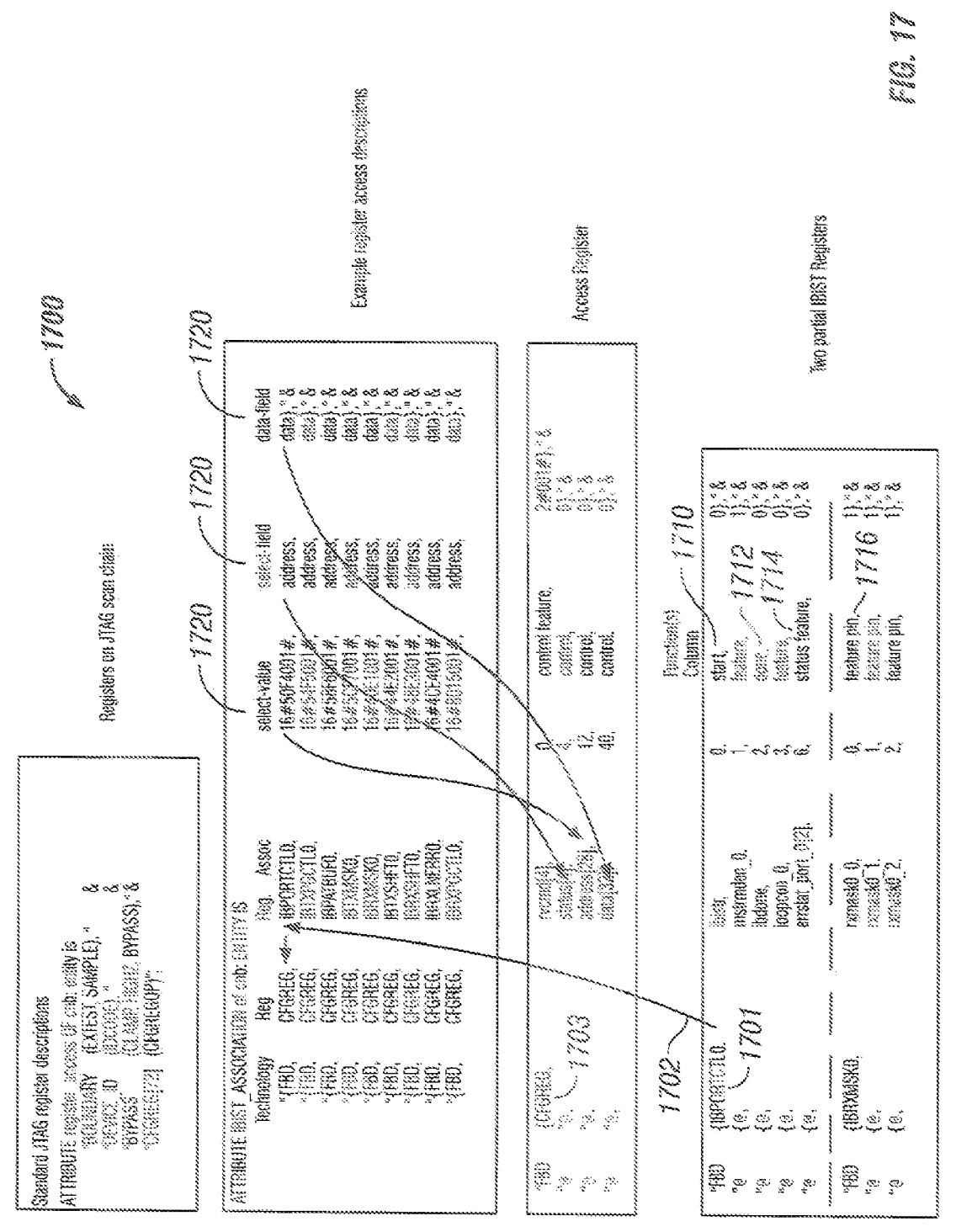

With reference now to FIG. 17, an example of additional register descriptions for a device are illustrated which includes three register descriptions: an access association list, and a standard JTAG declaration. FIG. 17 also shows how a test control program can search for the register functions 1710 to 1714 of FIG. 16. For instance, when the test control program loops through algorithm 1600 searching for start bits, it may search the device description(s) for register descriptions 1700 that include start bits 1710. Once the test control program finds a start bit 1710 it may access the register 1701 and load the start value (e.g. using a default value of "1" or a value located in a feature list) into the register. As described herein, the test control program may use the access information encapsulated with the register description to perform the access necessary to load the start value into the register 1701. In other words, the access code of the test control program would search for the register name 1701 in the IBIST ASSOCIATION 1702 noticing that the access register is "CFGREG" 1703. Additionally, the test control program places the contents of the register 1701 into the "data" field of 1720 and puts the address selection value into the "address" field. The test control program may also search the "feature" functions of the register CFGREG for the appropriate read or write feature value that is added. Then the test control program applies the register contents to the scan chain.

A similar method is used for all functions in 1610 to 1614 (of FIG. 16) during the execution of the test 1500 (shown in FIG. 15). For instance, as the test control program searches for "wait for done" functions 1512 it may search for the corresponding "done" entries 1712 in the register descriptions 1700. For another example, while the test controller is searching for errors to report 1513 and save 1514 it searches the register descriptions 1700 for "status" entries 1714. A dump function 1614c could cause the test control program to dump or save all register values.

Further, register description 1700 also illustrates that the test control program may search for and configure at least one other "function". More particularly, the test control program may search for the "pin" functions 1716 which would yield information on whether the user has disabled a particular port. Additionally, numerous other methods to access IBIST registers can be described in the BSDL file for use by the test control program. These other methods include, but are not limited to, using multiple registers on the scan chain (similar to 1703), using a register in a device on the scan chain to access a device (1703 in a different device) not on the scan chain, and using one or more registers (similar to 1701) that are in a device that are not on the scan chain and other combinations therein for register access using JTAG.

The practice of the present invention eliminates expensive and time consuming software maintenance of test control programs. The method of the present invention also results in fewer run time errors and less involved troubleshooting if errors do occur. Moreover, the present invention allows tests to be configured, run, and repeated much quicker than the prior art allows.

It is understood that the present invention can take many forms and embodiments. Accordingly, several variations may be made in the foregoing without departing from the spirit or the scope of the invention. For example, the functions associated with the GUI program and with the test control program may be provided in one COM DLL which provides all test configuration, setup, and test run time functions. However, the entry of test configuration data accomplished via the GUIs 600, 700, 800, 900, 1000, 1100, and 1200 can also be accomplished via coding (e.g., scripting) a test control program.

In another embodiment, the test control program and the GUI program are separate software entities and provide different functions, respectively, controlling the execution of the test and configuration of the test control program via GUIs 600, 700, 800, 900, 1000, 1100, and 1200. However, the test control program does not necessarily require the GUI 200. Nonetheless, in one embodiment, the test control program provides run time support for the GUI program. More particularly, the test control program may provide a COM interface for loading, unloading and starting the GUI program along with save/load support routines for the GUI. Otherwise, the test control program does not have to participate in displaying information on the GUIs 600, 700, 800, 900, 1000, 1100, and 1200. Likewise, since the GUI program could include the support functionality supplied by the test control program the GUI program does not necessarily require the test control program.

In summary, the GUI program uses the information in the circuit definition to automatically configure the GUI(s) 600, 700, 800, 900, 1000, 1100, and 1200. Independently of the GUI program, the test control program may use the information in the circuit definition to execute the test(s) that were configured using the GUIs 600, 700, 800, 900, 1000, 1100, and 1200 or otherwise scripted. When executed in a common system, though, the GUI program and the test control program provide the user a seamless and automated environment for executing tests while also accommodating modifications to the circuit under test. Additionally, the test control program and the GUI program may be combined in one software entity.

Having thus described the present invention by reference to certain of its preferred embodiments, it is noted that the embodiments disclosed are illustrative rather than limiting in nature and that a wide range of variations, modifications, modifications, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

The invention claimed is:

1. A data driven method for testing a circuit including at least one built-in-self-test compatible device, the method comprising:
   describing the built-in-self-test compatible device using a descriptive language including setting at least one default value associated with the device;
   defining a scan path associated with the circuit;
   defining a netlist of the circuit;
   configuring a test control program for the circuit;
   modifying the value associated with the device; and
   testing the circuit after modifying the value using the test control program and wherein a portion of the test control program associated with the value remains substantially unmodified.

2. The method of claim 1 wherein the device further comprises an IBIST compatible device.

3. The method of claim 1 further comprising describing a first register of the device.

4. The method of claim 3 further comprising changing the description of the first register, wherein the test control program remains substantially unmodified with respect to the modified first register description.

5. The method of claim 4 further comprising describing a second register as being accessed through the first register.

6. The method of claim 1 further comprising describing at least one register representing a port associated with the device.

7. The method of claim 6 further comprising modifying the register description.

8. The method of claim 1 wherein the defining the test control program includes defining a difference between the circuit to be tested and the circuit description.

9. The method of claim 8 further comprising using the difference during the testing wherein a portion of the test control program associated with the difference remains substantially unmodified.

10. The method of claim 8 wherein the configuring the test control program further comprises using a graphic user interface.

11. The method of claim 1 further comprising testing a new version of the circuit using the test control program.

12. The method of claim 1 further comprising accessing a register of the device through the test control program.

13. The method of claim 1 further comprising testing the circuit a second time and pre-determining that if an error occurs during the second test, then the test control program ran successfully whereby an investigation of a source of the error is limited to the circuit and the circuit description.

14. The method of claim 1 further comprising, if the circuit fails, outputting the contents of all registers associated with the test.

15. A data driven system for testing a circuit including at least one built-in-self-test compatible device, the system comprising:

a test rig adapted to communicate with the processor and with the circuit;
a memory for storing:
a description of the built-in-self-test compatible device in a descriptive language and including at least one default value associated with the device,
a definition of a scan path associated with the device,
a definition of a netlist of the circuit, and
a test control program for the circuit, the memory being adapted to store a modification to the value associated with the device; and
a processor adapted to execute the test control program to test the circuit after the value is modified and wherein a portion of the test control program associated with the value remains substantially unmodified.

16. The system of claim 15 wherein the device further comprises an IBIST compatible device.

17. The system of claim 15 wherein the device description further comprises a description of a first register of the device.

18. The system of claim 17 wherein the memory is further adapted to store a modification to the first register description wherein the test control program remains substantially unmodified.

19. The system of claim 18 wherein the description further comprises a description of a second register as being accessed through the first register.

20. The system of claim 15 wherein the description further comprises a description of at least one port associated with the device.

21. The system of claim 20 wherein the memory is further adapted to store a modification to the port description.

22. The system of claim 15 wherein the memory is further adapted to store a difference between the circuit to be tested and the circuit description.

23. The system of claim 15 further comprising a display, the memory being further adapted to store a graphic user interface for configuring the test control program.

24. The system of claim 15 the processor being further adapted to execute an operating system and to allow the test control program to access a register of the device through the operating system.

25. A computer program product for performing a data driven test of a circuit including a built-in-self-test compatible device, the computer program product tangibly embodied on a physical computer storage medium, the computer program product comprising:
computer code for accepting a description of the built-in-self-test compatible device in a descriptive language and including at least one default value associated with the device;
computer code for accepting a definition of a scan path associated with the device;
computer code for accepting a definition of a netlist of the circuit;
computer code for configuring a test control program for the circuit;
computer code for modifying the value associated with the device; and
computer code for testing the circuit after modifying the value using the test control program and wherein a portion of the test control program associated with the value remains substantially unmodified;
wherein all of the above computer code is executable by a processor.

26. The computer program product of claim 25 further comprising computer code for accepting a description of a first register of the device.

27. The computer program product of claim 26 further comprising computer code for accepting a modification to the first register description wherein the test control program remains substantially unmodified.

28. The computer program product of claim 26 further comprising computer code for accepting a description of a second register as being accessed through the first register.

29. The computer program product of claim 25 further comprising computer code for accepting a description of at least one port associated with the device.

30. The computer program product of claim 29 further comprising computer code for accepting a modification to the description of the port.

31. The computer program product of claim 25 further comprising computer code for defining a difference between the circuit to be tested and the circuit description.

32. The computer program product of claim 31 further comprising computer code for using the difference during the testing wherein a portion of the test control program associated with the difference remains substantially unmodified.

33. The computer program product of claim 32 further comprising computer code for configuring the test control program using a graphic user interface.

34. The computer program product of claim 25 further comprising computer code for accessing a register of the device through an operating system associated with running the test control program.

35. The computer program product of claim 25 further comprising computer code for, if the circuit fails, outputting the contents of a register.

36. A data driven method for testing a circuit including at least one built-in-self-test compatible device, the method comprising:
defining a circuit which includes a built-in-self-test compatible device including setting at least one default value associated with the device;
configuring a test control program for the circuit;
modifying the value associated with the device; and
testing the circuit after modifying the value using the test control program and wherein a portion of the test control program associated with the value remains substantially unmodified.

37. The method of claim 36 further comprising accessing a register using multiple methods of access.

38. The method of claim 36 wherein the test control program comprises an algorithm for applying a plurality of functions to a register of the device wherein the algorithm remains substantially unmodified.

39. The method of claim 36 further comprising using an operating system to access a register of the device wherein the device is a JTAG device.

* * * * *

UNITED STATES PATENT AND TRADEMARK OFFICE
CERTIFICATE OF CORRECTION

| | | |
|---|---|---|
| PATENT NO. | : 7,562,274 B2 | |
| APPLICATION NO. | : 11/465080 | |
| DATED | : July 14, 2009 | |
| INVENTOR(S) | : James Earnest Chorn et al. | |

It is certified that error appears in the above-identified patent and that said Letters Patent is hereby corrected as shown below:

On the title page, item [54] and column 1, line 1:
The title is corrected to read:

USER DATA DRIVEN TEST CONTROL
      SOFTWARE APPLICATION THAT REQUIRES
      NO SOFTWARE MAINTENANCE

Signed and Sealed this

First Day of September, 2009

David J. Kappos
*Director of the United States Patent and Trademark Office*